(12) United States Patent
Biskeborn et al.

(10) Patent No.: US 10,332,550 B2
(45) Date of Patent: **\*Jun. 25, 2019**

(54) TUNNEL MAGNETORESISTIVE SENSOR HAVING STABILIZED MAGNETIC SHIELD AND DIELECTRIC GAP SENSOR

(71) Applicant: International Business Machines Corporation, Armonk, NY (US)

(72) Inventors: Robert G. Biskeborn, Hollister, CA (US); Robert E. Fontana, Jr., San Jose, CA (US); Calvin S. Lo, Saratoga, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/788,550

(22) Filed: Oct. 19, 2017

(65) Prior Publication Data

US 2018/0053522 A1 Feb. 22, 2018

Related U.S. Application Data

(60) Continuation of application No. 15/587,163, filed on May 4, 2017, now Pat. No. 9,818,435, which is a
(Continued)

(51) Int. Cl.
*G11B 5/39* (2006.01)
*G01R 33/09* (2006.01)
*G11B 5/008* (2006.01)

(52) U.S. Cl.
CPC .......... *G11B 5/3912* (2013.01); *G01R 33/098* (2013.01); *G11B 5/00813* (2013.01); *G11B 5/3909* (2013.01); *G11B 5/3977* (2013.01)

(58) Field of Classification Search
None
See application file for complete search history.

(56) References Cited

U.S. PATENT DOCUMENTS 6,800,565 B2   10/2004  Hu et al.
7,180,712 B1 *  2/2007  Li ........................... G11B 5/112
                                                    257/E43.004
(Continued)

FOREIGN PATENT DOCUMENTS

EP   0911811 A2   4/1999
EP   1688923 A2   8/2006
EP   2320489 B1   5/2014

OTHER PUBLICATIONS

Wallash, "Electrostatic Discharge and Electrical Breakdown Study of the Head Disk Interface in a Hard Disk Drive," IEEE Transactions on Magnetics, vol. 40, No. 3, May 2004, pp. 1751-1755.
(Continued)

*Primary Examiner* — William J Klimowicz
(74) *Attorney, Agent, or Firm* — Zilka-Kotab, P.C.

(57) ABSTRACT

An apparatus according to one embodiment includes an array of magnetic transducers each having: a current-perpendicular-to-plane sensor, and a stabilizing layered structure adjacent the sensor. The stabilizing layered structure includes a first ferromagnetic layer, a second ferromagnetic layer, and an antiparallel coupling layer between the ferromagnetic layers. Each transducer also includes an electrical lead layer positioned between the sensor and the stabilizing layered structure. The electrical lead layer is in electrical communication with the sensor. Each transducer also includes a spacer layer between the respective electrical lead layer and the stabilizing layered structure. A conductivity of the electrical lead layer is higher than a conductivity of the spacer layer.

17 Claims, 11 Drawing Sheets

Related U.S. Application Data division of application No. 15/238,590, filed on Aug. 16, 2016, now Pat. No. 9,747,931.

(56) References Cited

U.S. PATENT DOCUMENTS

| | | | |
|---|---|---|---|
| 8,081,398 B2 | 12/2011 | Hachisuka | |
| 8,576,518 B1 | 11/2013 | Zeltser et al. | |
| 8,638,530 B1 | 1/2014 | Hsu et al. | |
| 8,675,318 B1 | 3/2014 | Ho et al. | |
| 8,780,506 B1 | 7/2014 | Maat et al. | |
| 8,797,692 B1 | 8/2014 | Guo et al. | |
| 9,065,043 B1 | 6/2015 | Xiao et al. | |
| 9,190,082 B2 | 11/2015 | Sapozhnikov et al. | |
| 9,508,367 B1* | 11/2016 | Biskeborn | G11B 5/3909 |
| 9,536,549 B1 | 1/2017 | Ge et al. | |
| 9,607,635 B1 | 3/2017 | Biskeborn et al. | |
| 9,747,931 B1* | 8/2017 | Biskeborn | G11B 5/3909 |
| 9,818,435 B1* | 11/2017 | Biskeborn | G11B 5/3909 |
| 2002/0186514 A1 | 12/2002 | Childress et al. | |
| 2003/0011944 A1 | 1/2003 | Hosomi | |
| 2003/0219626 A1* | 11/2003 | Partee | B82Y 10/00 |
| | | | 428/832 |
| 2004/0136121 A1 | 7/2004 | Mao et al. | |
| 2004/0137645 A1 | 7/2004 | Hu et al. | |
| 2007/0205766 A1 | 9/2007 | Kou | |
| 2007/0230062 A1 | 10/2007 | Maejima et al. | |
| 2008/0174920 A1 | 7/2008 | Hara et al. | |
| 2009/0279213 A1* | 11/2009 | Wu | G11B 5/3163 |
| | | | 360/319 |
| 2011/0019313 A1 | 1/2011 | Brown et al. | |
| 2012/0012953 A1 | 1/2012 | Lottis et al. | |
| 2012/0050919 A1 | 3/2012 | Brown et al. | |
| 2012/0087045 A1 | 4/2012 | Yanagisawa et al. | |
| 2012/0087046 A1 | 4/2012 | Yanagisawa et al. | |
| 2012/0212857 A1 | 8/2012 | Fuji et al. | |
| 2014/0266186 A1 | 9/2014 | Osterfeld et al. | |
| 2015/0002964 A1 | 1/2015 | Sapozhnikov et al. | |
| 2015/0138673 A1 | 5/2015 | Adrong et al. | |
| 2017/0154642 A1 | 6/2017 | Biskeborn et al. | |
| 2017/0221509 A1* | 8/2017 | Biskeborn | G11B 5/3909 |
| 2017/0294198 A1 | 10/2017 | Biskeborn et al. | |

OTHER PUBLICATIONS

Kim et al., "Characterization of an AlO Tunneling Banier in a Magnetic Tunnel Junction by a Surface Plasmon Resonance Spectroscopy Technique," IEEE Transactions on Magnetics, vol. 45, No. 1, Jan. 2009, pp. 60-63.

Biskeborn et al., U.S. Appl. No. 15/238,590, filed Aug. 16, 2016.

Biskeborn et al., U.S. Appl. No. 15/097,174, filed Apr. 12, 2016.

Biskeborn et al., U.S. Appl. No. 15/014,983, filed Feb. 3, 2016.

Biskeborn et al., U.S. Appl. No. 15/136,759, filed Apr. 22, 2016.

Restriction Requirement from U.S. Appl. No. 15/238,590, dated Jan. 18, 2017.

Notice of Allowance from U.S. Appl. No. 15/238,590, dated Apr. 19, 2017.

Corrected Notice of Allowance from U.S. Appl. No. 15/238,590, dated May 3, 2017.

Biskeborn et al., U.S. Appl. No. 15/587,163, dated May 4, 2017.

Supplemental Notice of Allowance from U.S. Appl. No. 15/238,590, dated May 24, 2017.

Notice of Allowance from U.S. Appl. No. 15/587,163, dated Jul. 5, 2017.

Supplemental Notice of Allowance from U.S. Appl. No. 15/587,163, dated Sep. 14, 2017.

\* cited by examiner

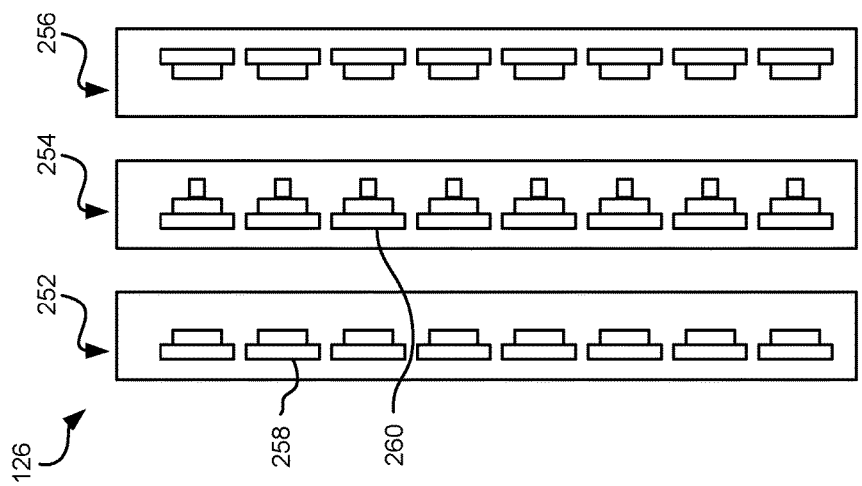
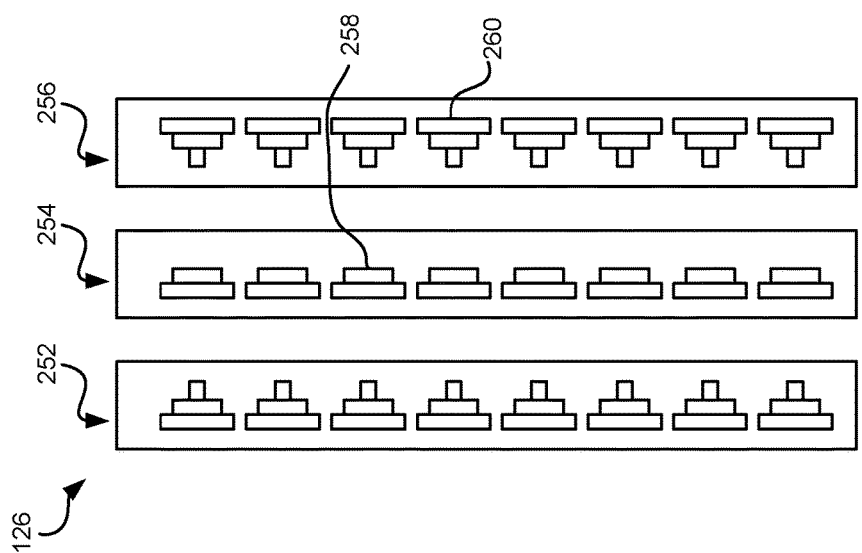

TUNNEL MAGNETORESISTIVE SENSOR HAVING STABILIZED MAGNETIC SHIELD AND DIELECTRIC GAP SENSOR

BACKGROUND

The present invention relates to data storage systems, and more particularly, this invention relates to magnetic heads, e.g. magnetic tape heads, which include tunnel magnetoresistance sensors.

In magnetic storage systems, magnetic transducers read data from and write data onto magnetic recording media. Data is written on the magnetic recording media by moving a magnetic recording transducer to a position over the media where the data is to be stored. The magnetic recording transducer then generates a magnetic field, which encodes the data into the magnetic media. Data is read from the media by similarly positioning the magnetic read transducer and then sensing the magnetic field of the magnetic media. Read and write operations may be independently synchronized with the movement of the media to ensure that the data can be read from and written to the desired location on the media.

An important and continuing goal in the data storage industry is that of increasing the density of data stored on a medium. For tape storage systems, that goal has led to increasing the track and linear bit density on recording tape, and decreasing the thickness of the magnetic tape medium. However, the development of small footprint, higher performance tape drive systems has created various problems in the design of a tape head assembly for use in such systems.

In a tape drive system, the drive moves the magnetic tape over the surface of the tape head at high speed. Usually the tape head is designed to minimize the spacing between the head and the tape. The spacing between the magnetic head and the magnetic tape is crucial and so goals in these systems are to have the recording gaps of the transducers, which are the source of the magnetic recording flux in near contact with the tape to effect writing sharp transitions, and to have the read elements in near contact with the tape to provide effective coupling of the magnetic field from the tape to the read elements.

SUMMARY

An apparatus according to one embodiment includes an array of magnetic transducers each having: a current-perpendicular-to-plane sensor, and a stabilizing layered structure adjacent the sensor. The stabilizing layered structure includes a first ferromagnetic layer, a second ferromagnetic layer, and an antiparallel coupling layer between the ferromagnetic layers. Each transducer also includes an electrical lead layer positioned between the sensor and the stabilizing layered structure. The electrical lead layer is in electrical communication with the sensor. Each transducer also includes a spacer layer between the respective electrical lead layer and the stabilizing layered structure. A conductivity of the electrical lead layer is higher than a conductivity of the spacer layer.

An apparatus according to another embodiment includes an array of magnetic transducers each having: a current-perpendicular-to-plane sensor, and a stabilizing layered structure adjacent the sensor. The stabilizing layered structure includes an antiferromagnetic layer, a first ferromagnetic layer, a second ferromagnetic layer, and an antiparallel coupling layer between the ferromagnetic layers. Each transducer also includes spacers on opposite sides of the sensor, at least one of the spacers being positioned between the sensor and the stabilizing layered structure. At least one of the spacers includes an electrically conductive ceramic layer.

Any of these embodiments may be implemented in a magnetic data storage system such as a tape drive system, which may include a magnetic head, a drive mechanism for passing a magnetic medium (e.g., recording tape) over the magnetic head, and a controller electrically coupled to the magnetic head.

Other aspects and embodiments of the present invention will become apparent from the following detailed description, which, when taken in conjunction with the drawings, illustrate by way of example the principles of the invention.

BRIEF DESCRIPTION OF THE DRAWINGS

FIG. 3 is a partial tape bearing surface view of a magnetic head having a write-read-write configuration.

FIG. 4 is a partial tape bearing surface view of a magnetic head having a read-write-read configuration.

DETAILED DESCRIPTION

Figure 1A:
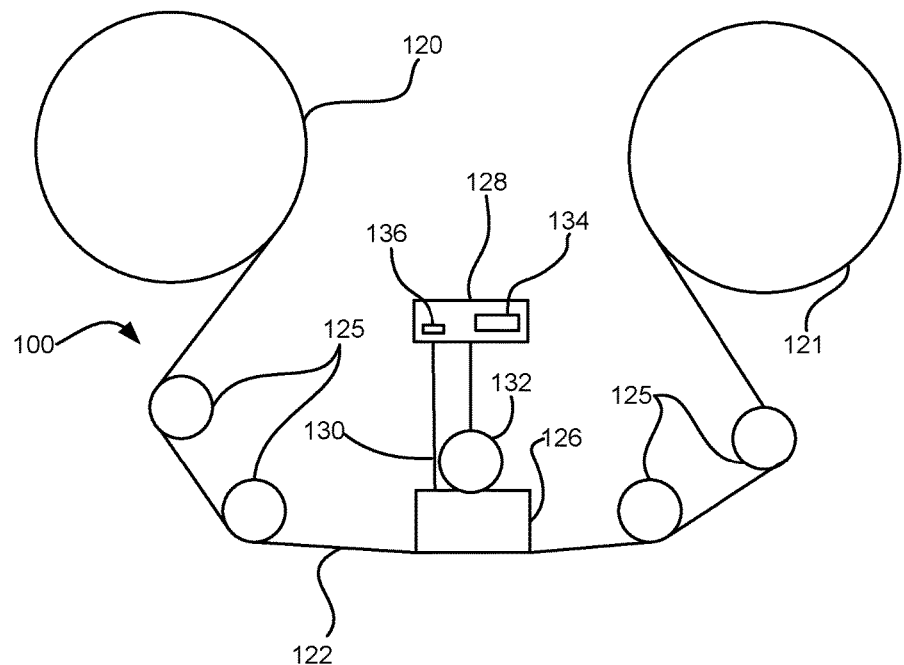
FIG. 1A is a schematic diagram of a simplified tape drive system according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of magnetic storage systems, as well as operation and/or component parts thereof.

In one general embodiment, an apparatus includes an array of magnetic transducers each having: a current-perpendicular-to-plane sensor, shields positioned on opposite sides of the sensor in an intended direction of media travel thereacross for providing magnetic shielding, and a stabilizing layered structure between at least one of the shields and the sensor. The stabilizing layered structure includes an antiferromagnetic layer, a first ferromagnetic layer adjacent the antiferromagnetic layer, a second ferromagnetic layer, and an antiparallel coupling layer between the ferromagnetic layers. The antiferromagnetic layer pins a magnetization direction in the first ferromagnetic layer along an antiferromagnetic polarized direction of the antiferromagnetic layer. A magnetization direction in the second ferromagnetic layer is opposite the magnetization direction in the first ferromagnetic layer. Each transducer also includes an electrical lead layer positioned between the sensor and the stabilizing layered structure. The electrical lead layer is in electrical communication with the sensor. Each transducer also includes a spacer layer between the respective electrical lead layer and the stabilizing layered structure. A conductivity of the electrical lead layer is higher than a conductivity of the spacer layer.

In another general embodiment, an apparatus includes an array of magnetic transducers each having: a current-perpendicular-to-plane sensor, magnetic shields on opposite sides of the sensor in an intended direction of media travel thereacross, and a stabilizing layered structure between at least one of the magnetic shields and the sensor. The stabilizing layered structure includes an antiferromagnetic layer, a first ferromagnetic layer adjacent the antiferromagnetic layer, a second ferromagnetic layer, and an antiparallel coupling layer between the ferromagnetic layers. The antiferromagnetic layer pins a magnetization direction in the first ferromagnetic layer along an antiferromagnetic polarized direction of the antiferromagnetic layer. A magnetization direction in the second ferromagnetic layer is opposite the magnetization direction in the first ferromagnetic layer. Each transducer also includes spacers on opposite sides of the sensor, at least one of the spacers being positioned between the sensor and the stabilizing layered structure. At least one of the spacers includes an electrically conductive ceramic layer.

FIG. 1A illustrates a simplified tape drive 100 of a tape-based data storage system, which may be employed in the context of the present invention. While one specific implementation of a tape drive is shown in FIG. 1A, it should be noted that the embodiments described herein may be implemented in the context of any type of tape drive system.

As shown, a tape supply cartridge 120 and a take-up reel 121 are provided to support a tape 122. One or more of the reels may form part of a removable cartridge and are not necessarily part of the system 100. The tape drive, such as that illustrated in FIG. 1A, may further include drive motor(s) to drive the tape supply cartridge 120 and the take-up reel 121 to move the tape 122 over a tape head 126 of any type. Such head may include an array of readers, writers, or both.

Guides 125 guide the tape 122 across the tape head 126. Such tape head 126 is in turn coupled to a controller 128 via a cable 130. The controller 128, may be or include a processor and/or any logic for controlling any subsystem of the drive 100. For example, the controller 128 typically controls head functions such as servo following, data writing, data reading, etc. The controller 128 may include at least one servo channel and at least one data channel, each of which include data flow processing logic configured to process and/or store information to be written to and/or read from the tape 122. The controller 128 may operate under logic known in the art, as well as any logic disclosed herein, and thus may be considered as a processor for any of the descriptions of tape drives included herein, in various embodiments. The controller 128 may be coupled to a memory 136 of any known type, which may store instructions executable by the controller 128. Moreover, the controller 128 may be configured and/or programmable to perform or control some or all of the methodology presented herein. Thus, the controller 128 may be considered to be configured to perform various operations by way of logic programmed into one or more chips, modules, and/or blocks; software, firmware, and/or other instructions being available to one or more processors; etc., and combinations thereof.

The cable 130 may include read/write circuits to transmit data to the head 126 to be recorded on the tape 122 and to receive data read by the head 126 from the tape 122. An actuator 132 controls position of the head 126 relative to the tape 122.

An interface 134 may also be provided for communication between the tape drive 100 and a host (internal or external) to send and receive the data and for controlling the operation of the tape drive 100 and communicating the status of the tape drive 100 to the host, all as will be understood by those of skill in the art.

Figure 1B:
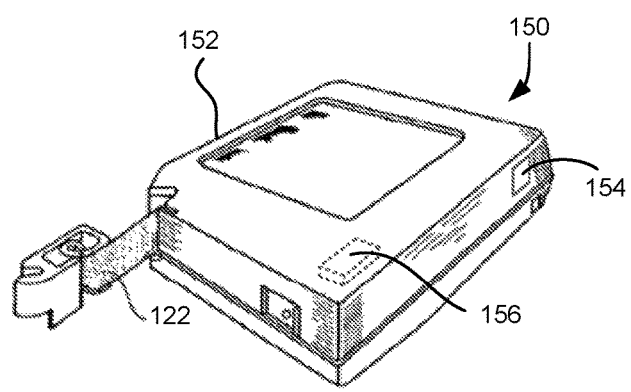
FIG. 1B is a schematic diagram of a tape cartridge according to one embodiment.

FIG. 1B illustrates an exemplary tape cartridge 150 according to one embodiment. Such tape cartridge 150 may be used with a system such as that shown in FIG. 1A. As shown, the tape cartridge 150 includes a housing 152, a tape 122 in the housing 152, and a nonvolatile memory 156 coupled to the housing 152. In some approaches, the nonvolatile memory 156 may be embedded inside the housing 152, as shown in FIG. 1B. In more approaches, the nonvolatile memory 156 may be attached to the inside or outside of the housing 152 without modification of the housing 152. For example, the nonvolatile memory may be embedded in a self-adhesive label 154. In one preferred embodiment, the nonvolatile memory 156 may be a Flash memory device, ROM device, etc., embedded into or coupled to the inside or outside of the tape cartridge 150. The nonvolatile memory is accessible by the tape drive and the tape operating software (the driver software), and/or other device.

Figure 2:
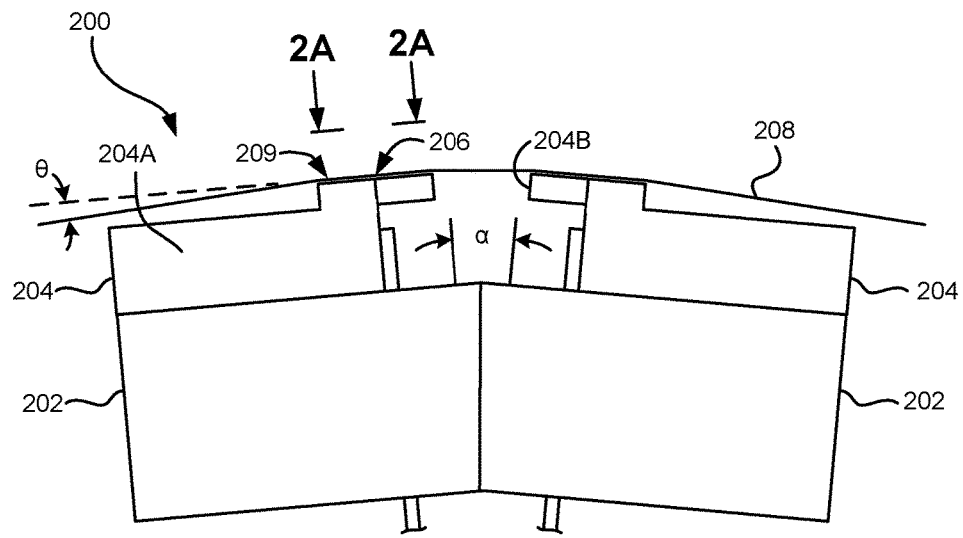
FIG. 2 illustrates a side view of a flat-lapped, bi-directional, two-module magnetic tape head according to one embodiment.

By way of example, FIG. 2 illustrates a side view of a flat-lapped, bi-directional, two-module magnetic tape head 200 which may be implemented in the context of the present invention. As shown, the head includes a pair of bases 202, each equipped with a module 204, and fixed at a small angle α with respect to each other. The bases may be "U-beams" that are adhesively coupled together. Each module 204 includes a substrate 204A and a closure 204B with a thin film portion, commonly referred to as a "gap" in which the readers and/or writers 206 are formed. In use, a tape 208 is moved over the modules 204 along a media (tape) bearing surface 209 in the manner shown for reading and writing data on the tape 208 using the readers and writers. The wrap angle θ of the tape 208 at edges going onto and exiting the flat media support surfaces 209 are usually between about 0.1 degree and about 3 degrees.

The substrates 204A are typically constructed of a wear resistant material, such as a ceramic. The closures 204B may be made of the same or similar ceramic as the substrates 204A.

The readers and writers may be arranged in a piggyback or merged configuration. An illustrative piggybacked configuration comprises a (magnetically inductive) writer transducer on top of (or below) a (magnetically shielded) reader transducer (e.g., a magnetoresistive reader, etc.), wherein the poles of the writer and the shields of the reader are generally separated. An illustrative merged configuration comprises one reader shield in the same physical layer as one writer pole (hence, "merged"). The readers and writers may also be arranged in an interleaved configuration. Alternatively, each array of channels may be readers or writers only. Any of these arrays may contain one or more servo track readers for reading servo data on the medium.

Figure 2A:
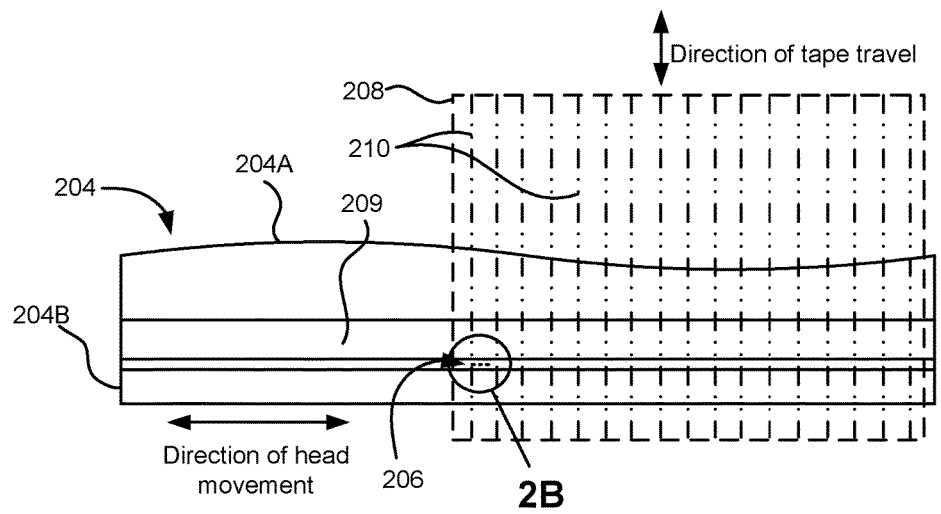
FIG. 2A is a tape bearing surface view taken from Line 2A of FIG. 2.

FIG. 2A illustrates the tape bearing surface 209 of one of the modules 204 taken from Line 2A of FIG. 2. A representative tape 208 is shown in dashed lines. The module 204 is preferably long enough to be able to support the tape as the head steps between data bands.

In this example, the tape 208 includes 4 to 32 data bands, e.g., with 16 data bands and 17 servo tracks 210, as shown in FIG. 2A on a one-half inch wide tape 208. The data bands are defined between servo tracks 210. Each data band may include a number of data tracks, for example 1024 data tracks (not shown). During read/write operations, the readers and/or writers 206 are positioned to specific track positions within one of the data bands. Outer readers, sometimes called servo readers, read the servo tracks 210. The servo signals are in turn used to keep the readers and/or writers 206 aligned with a particular set of tracks during the read/write operations.

Figure 2B:
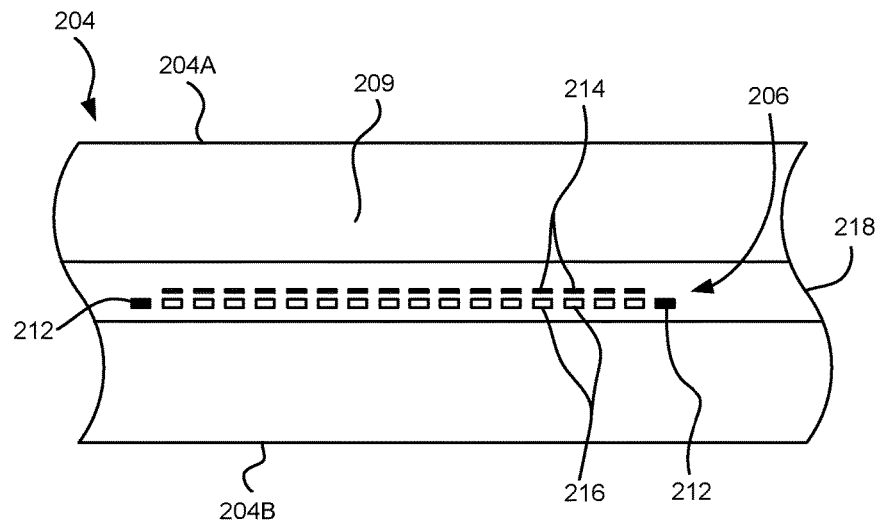
FIG. 2B is a detailed view taken from Circle 2B of FIG. 2A.

FIG. 2B depicts a plurality of readers and/or writers 206 formed in a gap 218 on the module 204 in Circle 2B of FIG. 2A. As shown, the array of readers and writers 206 includes, for example, 16 writers 214, 16 readers 216 and two servo readers 212, though the number of elements may vary. Illustrative embodiments include 8, 16, 32, 40, and 64 active readers and/or writers 206 per array, and alternatively interleaved designs having odd numbers of reader or writers such as 17, 25, 33, etc. An illustrative embodiment includes 32 readers per array and/or 32 writers per array, where the actual number of transducer elements could be greater, e.g., 33, 34, etc. This allows the tape to travel more slowly, thereby reducing speed-induced tracking and mechanical difficulties and/or execute fewer "wraps" to fill or read the tape. While the readers and writers may be arranged in a piggyback configuration as shown in FIG. 2B, the readers 216 and writers 214 may also be arranged in an interleaved configuration. Alternatively, each array of readers and/or writers 206 may be readers or writers only, and the arrays may contain one or more servo readers 212. As noted by considering FIGS. 2 and 2A-B together, each module 204 may include a complementary set of readers and/or writers 206 for such things as bi-directional reading and writing, read-while-write capability, backward compatibility, etc.

Figure 2C:
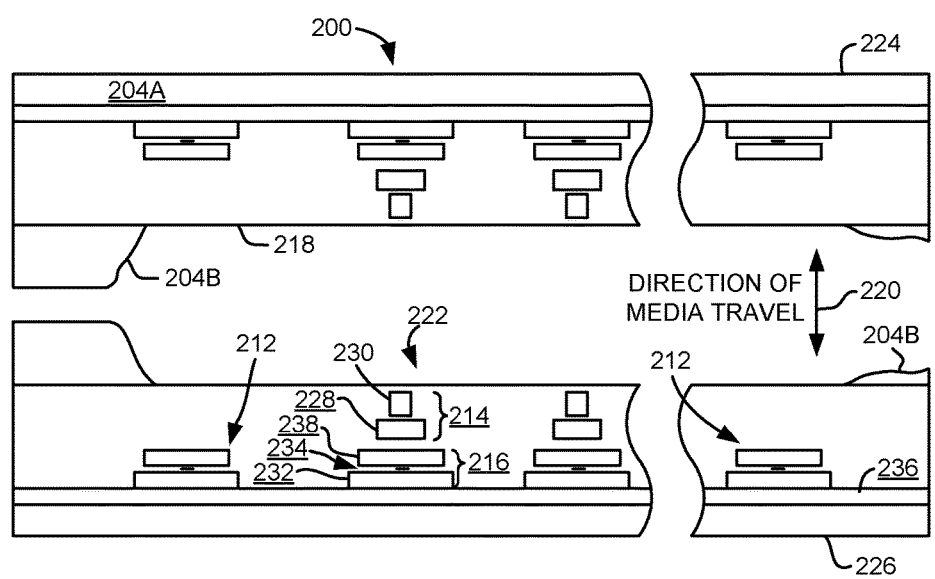
FIG. 2C is a detailed view of a partial tape bearing surface of a pair of modules.

FIG. 2C shows a partial tape bearing surface view of complementary modules of a magnetic tape head 200 according to one embodiment. In this embodiment, each module has a plurality of read/write (R/W) pairs in a piggyback configuration formed on a common substrate 204A and an optional electrically insulative layer 236. The writers, exemplified by the write transducer 214 and the readers, exemplified by the read transducer 216, are aligned parallel to an intended direction of travel of a tape medium thereacross to form an R/W pair, exemplified by the R/W pair 222. Note that the intended direction of tape travel is sometimes referred to herein as the direction of tape travel, and such terms may be used interchangeably. Such direction of tape travel may be inferred from the design of the system, e.g., by examining the guides; observing the actual direction of tape travel relative to the reference point; etc. Moreover, in a system operable for bi-direction reading and/or writing, the direction of tape travel in both directions is typically parallel and thus both directions may be considered equivalent to each other.

Several R/W pairs 222 may be present, such as 8, 16, 32 pairs, etc. The R/W pairs 222 as shown are linearly aligned in a direction generally perpendicular to a direction of tape travel thereacross. However, the pairs may also be aligned diagonally, etc. Servo readers 212 are positioned on the outside of the array of R/W pairs, the function of which is well known.

Generally, the magnetic tape medium moves in either a forward or reverse direction as indicated by arrow 220. The magnetic tape medium and head assembly 200 operate in a transducing relationship in the manner well-known in the art. The piggybacked MR head assembly 200 includes two thin-film modules 224 and 226 of generally identical construction.

Modules 224 and 226 are joined together with a space present between closures 204B thereof (partially shown) to form a single physical unit to provide read-while-write capability by activating the writer of the leading module and reader of the trailing module aligned with the writer of the leading module parallel to the direction of tape travel relative thereto. When a module 224, 226 of a piggyback head 200 is constructed, layers are formed in the gap 218 created above an electrically conductive substrate 204A (partially shown), e.g., of AlTiC, in generally the following order for the R/W pairs 222: an insulating layer 236, a first shield 232 typically of an iron alloy such as NiFe (–), cobalt zirconium tantalum (CZT) or Al—Fe—Si (Sendust), a sensor 234 for sensing a data track on a magnetic medium, a second shield 238 typically of a nickel-iron alloy (e.g., ~80/20 at % NiFe, also known as permalloy), first and second writer pole tips 228, 230, and a coil (not shown). The sensor may be of any known type, including those based on MR, GMR, AMR, tunneling magnetoresistance (TMR), etc.

The first and second writer poles 228, 230 may be fabricated from high magnetic moment materials such as ~45/55 NiFe. Note that these materials are provided by way of example only, and other materials may be used. Additional layers such as insulation between the shields and/or pole tips and an insulation layer surrounding the sensor may be present. Illustrative materials for the insulation include alumina and other oxides, insulative polymers, etc.

The configuration of the tape head 126 according to one embodiment includes multiple modules, preferably three or more. In a write-read-write (W-R-W) head, outer modules for writing flank one or more inner modules for reading. Referring to FIG. 3, depicting a W-R-W configuration, the outer modules 252, 256 each include one or more arrays of writers 260. The inner module 254 of FIG. 3 includes one or more arrays of readers 258 in a similar configuration. Variations of a multi-module head include a R-W-R head (FIG. 4), a R-R-W head, a W-W-R head, etc. In yet other variations, one or more of the modules may have read/write pairs of transducers. Moreover, more than three modules may be present. In further approaches, two outer modules may flank two or more inner modules, e.g., in a W-R-R-W, a R-W-W-R arrangement, etc. For simplicity, a W-R-W head is used primarily herein to exemplify embodiments of the present invention. One skilled in the art apprised with the teachings herein will appreciate how permutations of the present invention would apply to configurations other than a W-R-W configuration.

Figure 5:
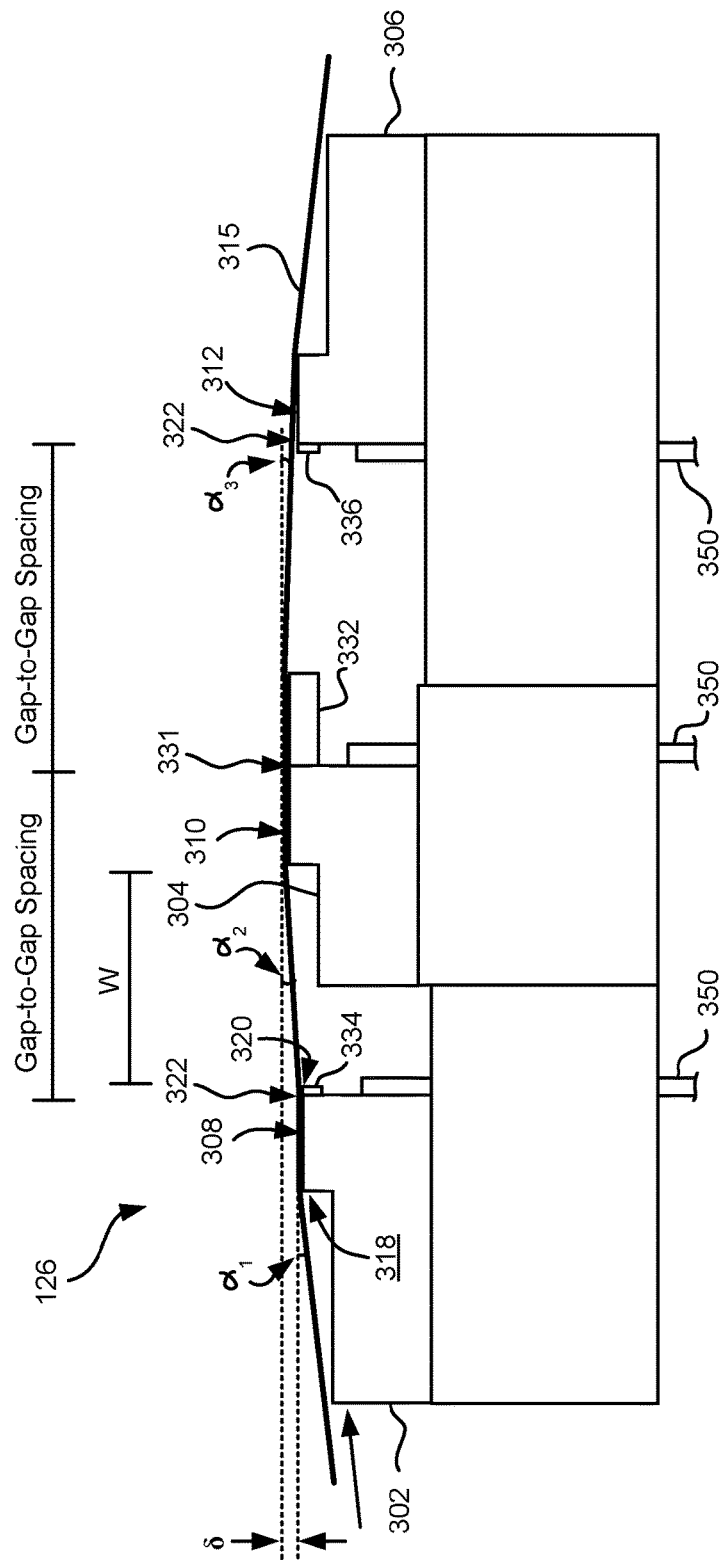
FIG. 5 is a side view of a magnetic tape head with three modules according to one embodiment where the modules all generally lie along about parallel planes.

FIG. 5 illustrates a magnetic head 126 according to one embodiment of the present invention that includes first, second and third modules 302, 304, 306 each having a tape bearing surface 308, 310, 312 respectively, which may be flat, contoured, etc. Note that while the term "tape bearing surface" appears to imply that the surface facing the tape 315 is in physical contact with the tape bearing surface, this is not necessarily the case. Rather, only a portion of the tape may be in contact with the tape bearing surface, constantly or intermittently, with other portions of the tape riding (or "flying") above the tape bearing surface on a layer of air, sometimes referred to as an "air bearing". The first module 302 will be referred to as the "leading" module as it is the first module encountered by the tape in a three module design for tape moving in the indicated direction. The third module 306 will be referred to as the "trailing" module. The trailing module follows the middle module and is the last module seen by the tape in a three module design. The leading and trailing modules 302, 306 are referred to collectively as outer modules. Also note that the outer modules 302, 306 will alternate as leading modules, depending on the direction of travel of the tape 315.

Figure 6:
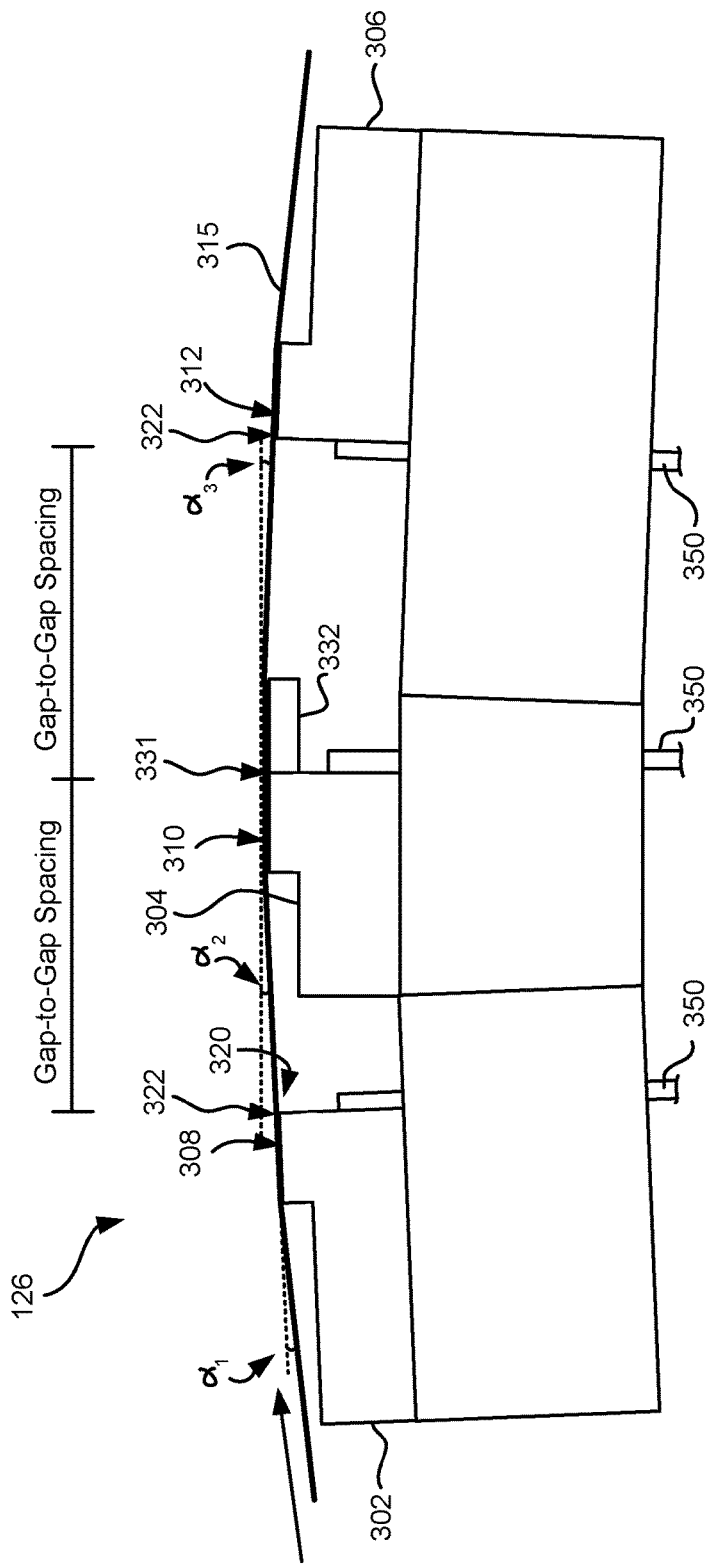
FIG. 6 is a side view of a magnetic tape head with three modules in a tangent (angled) configuration.

In one embodiment, the tape bearing surfaces 308, 310, 312 of the first, second and third modules 302, 304, 306 lie on about parallel planes (which is meant to include parallel and nearly parallel planes, e.g., between parallel and tangential as in FIG. 6), and the tape bearing surface 310 of the second module 304 is above the tape bearing surfaces 308, 312 of the first and third modules 302, 306. As described below, this has the effect of creating the desired wrap angle $\alpha_2$ of the tape relative to the tape bearing surface 310 of the second module 304.

Where the tape bearing surfaces 308, 310, 312 lie along parallel or nearly parallel yet offset planes, intuitively, the tape should peel off of the tape bearing surface 308 of the leading module 302. However, the vacuum created by the skiving edge 318 of the leading module 302 has been found by experimentation to be sufficient to keep the tape adhered to the tape bearing surface 308 of the leading module 302. The trailing edge 320 of the leading module 302 (the end from which the tape leaves the leading module 302) is the approximate reference point which defines the wrap angle $\alpha_2$ over the tape bearing surface 310 of the second module 304. The tape stays in close proximity to the tape bearing surface until close to the trailing edge 320 of the leading module 302. Accordingly, read and/or write elements 322 may be located near the trailing edges of the outer modules 302, 306. These embodiments are particularly adapted for write-read-write applications.

A benefit of this and other embodiments described herein is that, because the outer modules 302, 306 are fixed at a determined offset from the second module 304, the inner wrap angle $\alpha_2$ is fixed when the modules 302, 304, 306 are coupled together or are otherwise fixed into a head. The inner wrap angle $\alpha_2$ is approximately $\tan^{-1}$ ($\delta$/W) where $\delta$ is the height difference between the planes of the tape bearing surfaces 308, 310 and W is the width between the opposing ends of the tape bearing surfaces 308, 310. An illustrative inner wrap angle $\alpha_2$ is in a range of about 0.3° to about 1.1°, though can be any angle required by the design.

Beneficially, the inner wrap angle $\alpha_2$ on the side of the module 304 receiving the tape (leading edge) will be larger than the inner wrap angle $\alpha_3$ on the trailing edge, as the tape 315 rides above the trailing module 306. This difference is generally beneficial as a smaller $\alpha_3$ tends to oppose what has heretofore been a steeper exiting effective wrap angle.

Note that the tape bearing surfaces 308, 312 of the outer modules 302, 306 are positioned to achieve a negative wrap angle at the trailing edge 320 of the leading module 302. This is generally beneficial in helping to reduce friction due to contact with the trailing edge 320, provided that proper consideration is given to the location of the crowbar region that forms in the tape where it peels off the head. This negative wrap angle also reduces flutter and scrubbing damage to the elements on the leading module 302. Further, at the trailing module 306, the tape 315 flies over the tape bearing surface 312 so there is virtually no wear on the elements when tape is moving in this direction. Particularly, the tape 315 entrains air and so will not significantly ride on the tape bearing surface 312 of the third module 306 (some contact may occur). This is permissible, because the leading module 302 is writing while the trailing module 306 is idle.

Writing and reading functions are performed by different modules at any given time. In one embodiment, the second module 304 includes a plurality of data and optional servo readers 331 and no writers. The first and third modules 302, 306 include a plurality of writers 322 and no data readers, with the exception that the outer modules 302, 306 may include optional servo readers. The servo readers may be used to position the head during reading and/or writing operations. The servo reader(s) on each module are typically located towards the end of the array of readers or writers.

By having only readers or side by side writers and servo readers in the gap between the substrate and closure, the gap length can be substantially reduced. Typical heads have piggybacked readers and writers, where the writer is formed above each reader. A typical gap is 20-35 microns. However, irregularities on the tape may tend to droop into the gap and create gap erosion. Thus, the smaller the gap is the better. The smaller gap enabled herein exhibits fewer wear related problems.

In some embodiments, the second module 304 has a closure, while the first and third modules 302, 306 do not have a closure. Where there is no closure, preferably a hard coating is added to the module. One preferred coating is diamond-like carbon (DLC).

In the embodiment shown in FIG. 5, the first, second, and third modules 302, 304, 306 each have a closure 332, 334, 336, which extends the tape bearing surface of the associated module, thereby effectively positioning the read/write elements away from the edge of the tape bearing surface. The closure 332 on the second module 304 can be a ceramic closure of a type typically found on tape heads. The closures 334, 336 of the first and third modules 302, 306, however, may be shorter than the closure 332 of the second module 304 as measured parallel to a direction of tape travel over the respective module. This enables positioning the modules closer together. One way to produce shorter closures 334, 336 is to lap the standard ceramic closures of the second module 304 an additional amount. Another way is to plate or deposit thin film closures above the elements during thin film processing. For example, a thin film closure of a hard material such as Sendust or nickel-iron alloy (e.g., 45/55) can be formed on the module.

With reduced-thickness ceramic or thin film closures 334, 336 or no closures on the outer modules 302, 306, the write-to-read gap spacing can be reduced to less than about 1 mm, e.g., about 0.75 mm, or 50% less than commonly-used LTO tape head spacing. The open space between the modules 302, 304, 306 can still be set to approximately 0.5 to 0.6 mm, which in some embodiments is ideal for stabilizing tape motion over the second module 304.

Depending on tape tension and stiffness, it may be desirable to angle the tape bearing surfaces of the outer modules relative to the tape bearing surface of the second module. FIG. 6 illustrates an embodiment where the modules 302, 304, 306 are in a tangent or nearly tangent (angled) configuration. Particularly, the tape bearing surfaces of the outer modules 302, 306 are about parallel to the tape at the desired wrap angle $\alpha_2$ of the second module 304. In other words, the planes of the tape bearing surfaces 308, 312 of the outer modules 302, 306 are oriented at about the desired wrap angle $\alpha_2$ of the tape 315 relative to the second module 304. The tape will also pop off of the trailing module 306 in this embodiment, thereby reducing wear on the elements in the trailing module 306. These embodiments are particularly useful for write-read-write applications. Additional aspects of these embodiments are similar to those given above.

Typically, the tape wrap angles may be set about midway between the embodiments shown in FIGS. 5 and 6.

Figure 7:
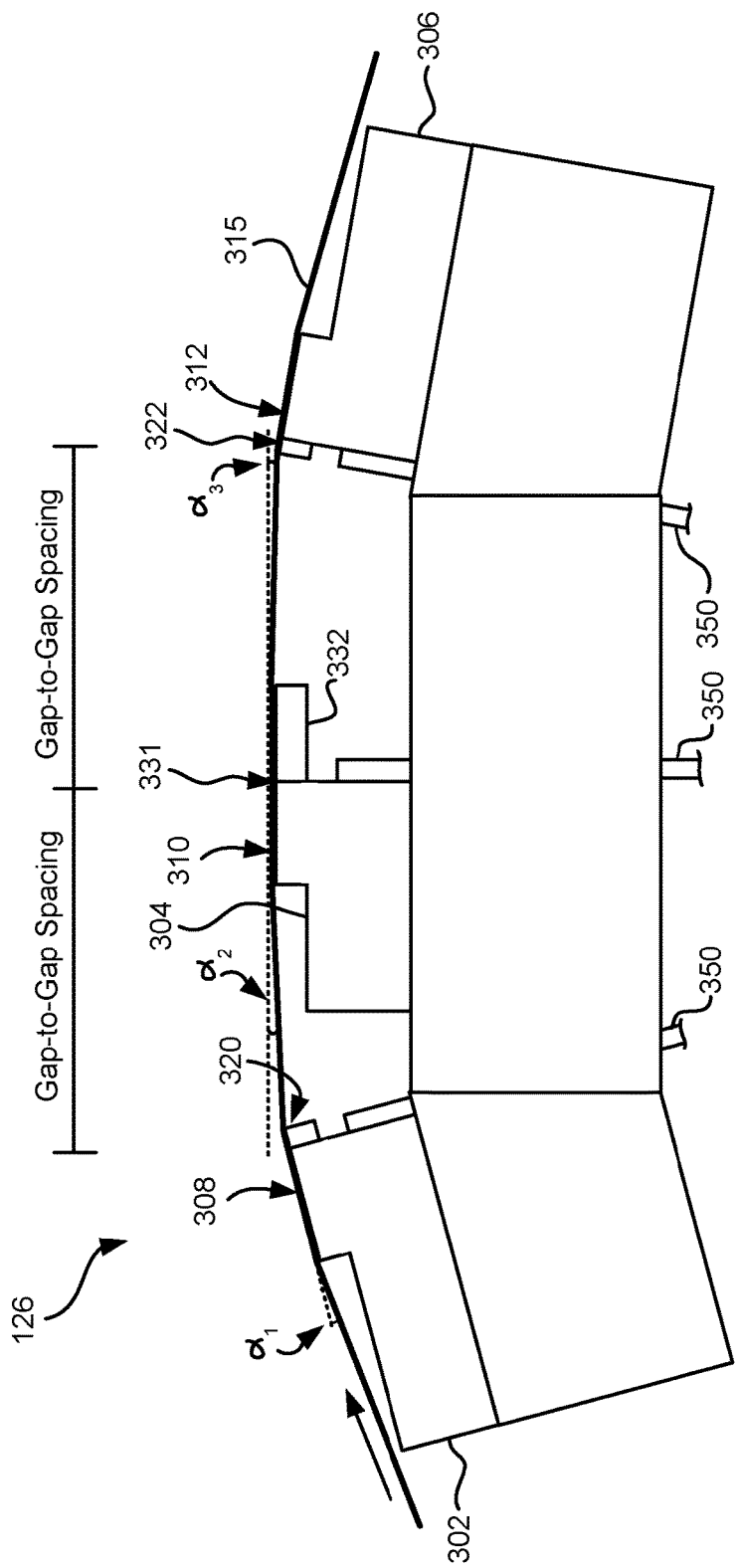
FIG. 7 is a side view of a magnetic tape head with three modules in an overwrap configuration.

FIG. 7 illustrates an embodiment where the modules 302, 304, 306 are in an overwrap configuration. Particularly, the tape bearing surfaces 308, 312 of the outer modules 302, 306 are angled slightly more than the tape 315 when set at the desired wrap angle $\alpha_2$ relative to the second module 304. In this embodiment, the tape does not pop off of the trailing module, allowing it to be used for writing or reading. Accordingly, the leading and middle modules can both perform reading and/or writing functions while the trailing module can read any just-written data. Thus, these embodiments are preferred for write-read-write, read-write-read, and write-write-read applications. In the latter embodiments, closures should be wider than the tape canopies for ensuring read capability. The wider closures may require a wider gap-to-gap separation. Therefore, a preferred embodiment has a write-read-write configuration, which may use shortened closures that thus allow closer gap-to-gap separation.

Additional aspects of the embodiments shown in FIGS. 6 and 7 are similar to those given above.

A 32 channel version of a multi-module head 126 may use cables 350 having leads on the same or smaller pitch as current 16 channel piggyback LTO modules, or alternatively the connections on the module may be organ-keyboarded for a 50% reduction in cable span. Over-under, writing pair unshielded cables may be used for the writers, which may have integrated servo readers.

The outer wrap angles $\alpha_1$ may be set in the drive, such as by guides of any type known in the art, such as adjustable rollers, slides, etc. or alternatively by outriggers, which are integral to the head. For example, rollers having an offset axis may be used to set the wrap angles. The offset axis creates an orbital arc of rotation, allowing precise alignment of the wrap angle $\alpha_1$.

To assemble any of the embodiments described above, conventional u-beam assembly can be used. Accordingly, the mass of the resultant head may be maintained or even reduced relative to heads of previous generations. In other approaches, the modules may be constructed as a unitary body. Those skilled in the art, armed with the present teachings, will appreciate that other known methods of manufacturing such heads may be adapted for use in constructing such heads. Moreover, unless otherwise specified, processes and materials of types known in the art may be adapted for use in various embodiments in conformance with the teachings herein, as would become apparent to one skilled in the art upon reading the present disclosure.

With continued reference to the above described apparatuses, it would be advantageous for tape recording heads to include CPP MR sensor technology, e.g., such as TMR and GMR. Furthermore, with the continued reduction of data track widths in magnetic storage technologies, CPP MR sensors enable readback of data in ultra-thin data tracks due to their high level of sensitivity in such small operating environments.

As will be appreciated by one skilled in the art, by way of example, TMR is a magnetoresistive effect that occurs with a magnetic tunnel junction. TMR sensors typically include two ferromagnetic layers separated by a thin insulating barrier layer. If the barrier layer is thin enough e.g., less than about 15 angstroms, electrons can tunnel from one ferromagnetic layer to the other ferromagnetic layer, passing through the insulating material and thereby creating a current. Variations in the current, caused by the influence of external magnetic fields from a magnetic medium on the free ferromagnetic layer of the TMR sensor, correspond to data stored on the magnetic medium.

It is well known that TMR and other CPP MR sensors are particularly susceptible to shorting during fabrication due to abrasive lapping particles that scratch or smear conductive material across the insulating materials separating the conductive leads, e.g., opposing shields, which allow sense (bias) current to flow through the sensor and magnetic head as whole. Friction between asperities on the tape and the ductile metallic films in the sensor gives rise to deformation forces in the direction of tape motion. As a result, an electrical short is created by the scratching and/or smearing across the layers which has a net effect of creating bridges of conductive material across the sensor. Particularly, the lapping particles tend to plow through ductile magnetic material, e.g., from one or both shields, smearing the metal across the insulating material, and thereby creating an electrical short that reduces the effective resistance of the sensor and diminishes the sensitivity of the sensor as a whole.

Scientists and engineers familiar with tape recording technology would not expect a CPP MR sensor to remain operable (e.g., by not experiencing shorting) in a contact recording environment such as tape data storage, because of the near certain probability that abrasive asperities embedded in the recording medium will scrape across the thin insulating layer during tape travel, thereby creating the aforementioned shorting.

Typical CPP MR sensors such as TMR sensors in hard disk drive applications are configured to be in electrical contact with the top and bottom shields of read head structures. In such configurations the current flow is constrained to traveling between the top shield and the bottom shield through the sensor, by an insulator layer with a thickness of about 3 to about 100 nanometers (nm). This insulator layer extends below the hard bias magnet layer to insulate the bottom of the hard bias magnet from the bottom shield/lead layers, and isolates the edges of the sensor from the hard bias magnet material. In a tape environment, where the sensor is in contact with the tape media, smearing of the top or bottom shield material can bridge the insulation layer separating the hard bias magnet from the bottom lead and lower shield, thereby shorting the sensor. Further, shield deformation or smearing can create a conductive bridge across a tunnel barrier layer in a TMR sensor. Such tunnel barrier layer may be only 12 angstroms wide or less.

In disk drives, conventional CPP MR designs are acceptable because there is minimal contact between the head and the media. However, for tape recording, the head and the media are in constant contact. Head coating has been cited as a possible solution to these shorting issues; however, tape particles and asperities have been known to scratch through and/or wear away these coating materials as well. Furthermore, conventional magnetic recording head coatings are not available for protecting against defects during lapping processes as the coating is applied after these process steps. Because the insulating layers of a conventional CPP MR sensor are significantly thin, the propensity for electrical shorting due, e.g., to scratches, material deposits, surface defects, films deformation, etc., is high. Embodiments described herein implement novel spacer layers in combination with CPP MR sensors. As a result, some of the embodiments described herein may be able to reduce the probability of, or even prevent, shorting in the most common areas where shorting has been observed, e.g. the relatively larger areas on opposite sides of the sensor between the shields.

The potential use of CPP MR sensors in tape heads has heretofore been thought to be highly undesirable, as tape heads include multiple sensors, e.g., 16, 32, 64, etc., on a single die. Thus, if one or more of those sensors become inoperable due to the aforementioned shorting, the entire head becomes defective and typically would need to be discarded and/or replaced for proper operation of the apparatus.

Conventional current in-plane type sensors require at least two shorting events across different parts of the sensor in order to affect the sensor output, and therefore such heads are far less susceptible to shorting due to scratches. In contrast, tape heads with CPP MR sensors may short with a single event, which is another reason that CPP MR sensors have not been adopted into contact recording systems.

In addition to the difficulties associated with shorting, noise also presents difficulties in transducer function. Noise may be introduced in tape storage system environments, e.g., due to domain motions (where each domain is a coherent unit of magnetism) in the top and bottom shields surrounding the sensor. The orientation of the magnetic domain in the free layer, which is used to detect magnetic transitions on a magnetic medium, e.g., a tape, may undesirably and/or unpredictably transition in response to unstable magnetic domains in the shields. For example, magnetization domains in the shields may unpredictably change orientation as current is passed through a sensor stack while reading a magnetic medium. These transitions may be indiscernible from functional data signal transitions, e.g., transitions caused by varied resistance and voltage values during media reading, and thus such noise may lead to degraded read performance. Such noise issues have been found to be especially problematic in TMR heads.

Embodiments described herein address both shorting issues and performance-degrading noise by having top and/or bottom shields electrically isolated from the sensor, and including antiferromagnetic stabilizing structure(s) below the top shield and/or above the bottom shield to stabilize and/or counterbalance domain magnetization interactions in the shields. In other words, the embodiments described herein have the stabilizing layered structures below the top and/or bottom shields electrically isolated from a TMR sensor, thereby improving shield-to-sensor or shield-to-shield shorting which causes diminished sensor accuracy and/or total inoperability. Furthermore, the combination of antiferromagnetic stabilizing structures and electrically isolating these structures from the TMR sensor may synergistically reduce noise.

Some of the embodiments described herein include spacer layers which are preferably in close proximity to the sensing structure, thereby resisting deformation and thereby the previously experienced shorting as well, as will be described in further detail below.

Figure 8A:
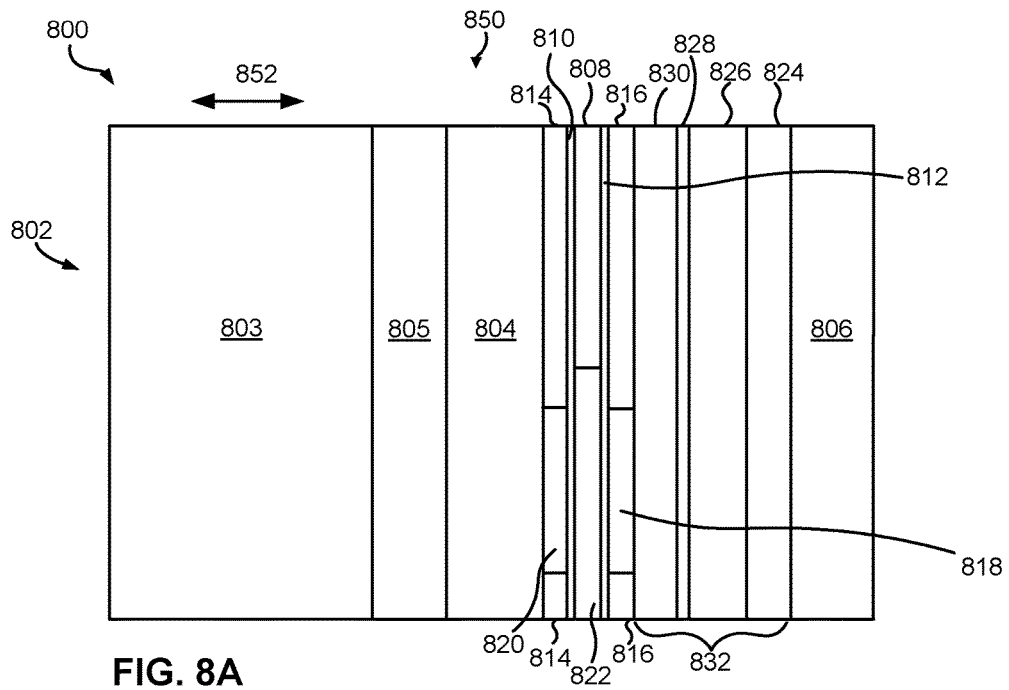
FIG. 8A is a partial side view of a media facing side of a transducer structure according to one embodiment.

FIG. 8A depicts an apparatus 800, in accordance with one embodiment. As an option, the present apparatus 800 may be implemented in conjunction with features from any other embodiment listed herein, such as those described with reference to the other FIGS. However, such apparatus 800 and others presented herein may be used in various applications and/or in permutations which may or may not be specifically described in the illustrative embodiments listed herein. Further, the apparatus 800 presented herein may be used in any desired environment. Thus FIG. 8 (and the other FIGS.) may be deemed to include any possible permutation.

Apparatus 800 includes a magnetic read transducer 802. Although FIG. 8A illustrates only a single magnetic read transducer 802, apparatus 800 may include one or more additional magnetic read transducers on a remainder of a module, e.g., in an array such as in FIGS. 2B-4. Accordingly, the components and/or configurations of magnetic read transducer 802 may be incorporated in any magnetic read transducer described herein.

The magnetic read transducer 802 includes a current-perpendicular-to-plane (CPP) sensor 808, e.g. a tunnel magnetoresistive (TMR) sensor.

According to some embodiments, the sensor 808 may be configured as a data sensor for reading data tracks of a magnetic medium.

According to other embodiments, the sensor 808 may be configured as a servo pattern reading sensor of a servo reader. For example, the sensor 808 may be configured as a servo pattern reading sensor where apparatus 800 includes one or more arrays of data readers and/or writers and one or more servo track readers for reading servo data on a medium.

The magnetic read transducer 802 may also include magnetic shields 804, 806 on opposite sides of the CPP sensor 808 (e.g. such as a TMR sensor, GMR sensor, etc.) in an intended direction 852 of media travel thereacross with a lower shield 804 above a wafer 803. In some approaches, the transducer 802 may include an optional undercoat 805 above the wafer 803 and below the lower shield 804. The upper shield 806 may be positioned above the lower shield 804 (e.g., in a deposition direction thereof). As would be appreciated by one skilled in the art, upper and lower shields 806, 804 preferably provide magnetic shielding for the CPP sensor 808. Thus, one or both of the upper and lower shields 806, 804 may desirably include a magnetic material of a type known in the art, for example, permalloy, e.g., a ferromagnetic alloy of nickel and iron.

The magnetic read transducer 802 may also include a stabilizing layered structure 832 between at least one of the magnetic shields 804, 806 and the sensor 808. For example, FIG. 8A includes a single stabilizing layered structure 832 between the upper magnetic shield 806 and the sensor 808.

According to further embodiments, as will be described in further detail elsewhere herein (see, e.g., FIGS. 8B, 9 and 10), the magnetic read transducer 802 may include a stabilizing layered structure 832, 842 below the sensor 808, or between each of the magnetic shields 804, 806 and the sensor 808.

A stabilizing layered structure 832 may include an antiparallel pinned layer structure of magnetic material to create an essentially single domain environment close to the sensor.

With continued reference to FIG. 8A, various embodiments include a stabilizing layered structure 832 with an antiferromagnetic (AFM) layer 824. The AFM layer 824 may be of conventional materials, e.g., IrMn, IrMnCr, etc. In the AFM layer 824, the magnetic moments of atoms or molecules, usually related to the spins of electrons, align in a regular pattern with neighboring spins (on different sub-lattices) pointing in opposite directions. Accordingly, the AFM layer has no et moment. However, it does have a magnetic orientation along the AFM polarized direction.

A stabilizing layered structure 832 may also include a first ferromagnetic (FM) layer 826 adjacent the AFM layer 824. The first FM layer 826 is pinned by the AFM layer 824 via exchange coupling.

A stabilizing layered structure 832 also includes a second FM layer 830 that is separated from the first FM layer 826 by an antiparallel (AP) coupling layer 828 between the FM layers 826, 830. The anti-parallel coupling (APC) layer 828 establishes an antiparallel coupling between the FM layers 826, 830 whereby the magnetic orientations of the FM layers are pinned in directions oriented antiparallel to each other. The AFM layer 824 pins the first FM layer 826 along the AFM polarized direction of the AFM layer 824. The first FM layer 826 pins the second FM layer 830 via exchange coupling across the APC layer 828. The opposite magnetization directions in the FM layers 826, 830 may establish a substantially close to zero net magnetization (also referred herein to as "neutral net magnetization") in the stabilizing layered structure 832.

The FM layers 826, 830 may be formed of any suitable material, such as CoFe, NiFe, ferromagnetic material that would be appreciated by one skilled in the art upon reading the present description, etc. The APC layer 828 may be a thin ruthenium layer, e.g., with a thickness up to about 8 angstroms.

It should be noted that the strength of the antiferromagnetic coupling in the stabilizing layered structure 832 may preferably be configured to allow the FM layers 826, 830 to be magnetically permeable and thereby provide magnetic shielding, while maintaining single domain characteristics, e.g., a magnetic orientation in a single direction.

The stabilizing layered structure 832 spatially distances the sensor 808 from the one or more unstable magnetic shields 804, 806, which may exhibit the aforementioned magnetization domains that unpredictably change orientation, thereby minimizing any adverse effects thereof on the sensor 808. Moreover, the stabilizing layered structure 832 provides magnetic shielding for the sensor 808 via the FM layers 826, 830. Because the FM layers 826, 830 are pinned, they do not exhibit any significant change in orientation of the magnetization domains thereof.

It follows that, in embodiments where one or both of the magnetic shields 804, 806 include unstable magnetic domains, the read performance of the sensor 808 may be maintained by a stabilizing layered structure 832 spatially distancing the sensor 808 from the one or more unstable magnetic shields 804, 806.

The neutral net magnetization in the stabilizing layered structure 832 may also enable and/or promote a relatively higher read performance of the sensor 808, by limiting the presence of additional undesirable magnetic flux in the magnetic read transducer 802 that may contribute to performance degrading noise.

Nonmagnetic spacers, e.g. dielectric spacers, may further decrease degrading noise as well as resist deformation and reduce shorting across the sensor. The magnetic read transducer 802 may also include a dielectric spacer positioned between the stabilizing layered structure 832 and the sensor 808.

An apparatus 800 that has a magnetic read transducer 802 may include an electrical lead layer 812 between the sensor 808 and upper shield 806 (e.g., the shield closest thereto). As depicted in the illustrative embodiment of FIG. 8A, the electrical lead layer 812 may be positioned between the sensor 808 and the stabilizing layered structure 832. A second electrical lead layer 810 may be included between the sensor and the lower shield 804 (e.g., the shield closest thereto). The first and second electrical lead layers 812, 810 are preferably in electrical communication with the sensor 808, e.g., to enable an electrical current to pass through the sensor 808.

First and second spacer layers 816, 814 may also be included in the transducer structure 802. The spacer layers 816, 814 may be dielectric in some approaches, but may be conductive ceramic in other approaches. In yet other approaches, the spacer layers 816, 814 may be both dielectric and conductive ceramic. The spacer layers 816, 814 preferably have a very low ductility, e.g., have a high resistance to bending and deformation in general, and ideally a lower ductility than refractory metals such as Jr, Ta, and Ti. First spacer layer 816 may be positioned such that it is sandwiched between the first electrical lead layer 812 and the upper shield 806 (e.g., the shield closest thereto) where, as shown in FIG. 8A, the stabilizing layered structure 832 is positioned between the first spacer 816 and the upper shield 806. Similarly, the second spacer layer 814 may be positioned between the second electrical lead layer 810 and the lower shield 804 (e.g., the shield closest thereto) where a conductivity of the electrical lead layers 810, 812 may be higher than a conductivity of the spacer layers 814, 816.

As described above, it is not uncommon for tape asperities passing over the sensor to smear the material of an upper or lower shield onto the opposite shield, thereby potentially shorting the sensor. First and second spacer layers 814, 816 reduce the probability of a smear occurring in the sensor region. Moreover, because the first and second electrical lead layers 810, 812 are separated from the upper and lower shields 806, 804 at the tape bearing surface by the first and second spacer layers 814, 816 respectively, the probability of a smear bridging the first and second electrical lead layers 810, 812 is minimized.

Thus, as illustrated in FIG. 8A, it is preferred that the first and second spacer layers 816, 814 are positioned at the media facing surface 850 of the transducer structure 802, e.g., such that the sensor 808 and/or electrical lead layers 810, 812 are separated from the stabilizing layered structures 832, 842, and/or the upper shields 806 and lower shields 804, thereby reducing the chance of a shorting event occurring. Moreover, it is preferred that the material composition of the first and second spacer layers 816, 814 is sufficiently resistant to smearing and/or plowing of conductive material across the sensor 808. Thus, the first and second spacer layers 816, 814 are preferably hard, e.g., at least hard enough to prevent asperities in the tape passing over the transducer structure 802 from causing deformations in the media facing surface 850 of the transducer structure 802 which effect the performance of the sensor 808.

In preferred embodiments, the first and/or second spacer layers 816, 814 may include aluminum oxide. However, according to various embodiments, the first and/or second spacer layers 816, 814 may include at least one of aluminum oxide, chrome oxide, silicon nitride, boron nitride, silicon carbide, silicon oxide, titanium oxide, ceramics, etc., and/or combinations thereof. Furthermore, in various embodiments, the first and/or second electrical lead layers 812, 810 may include any suitable conductive material, e.g., which may include Jr, Cu, Ru, Pt, NiCr, Au, Ag, Ta, Cr, etc.; a sandwiched structure of Ta (e.g. Ta/X/Ta); conductive hard alloys such as titanium nitride, boron nitride, silicon carbide, and the like.

Furthermore, according to one embodiment of the apparatus 800 as depicted in FIG. 8A, the magnetic read transducer 802 includes the first spacer layer 816 may be positioned between the first electrical lead layer 812 and the stabilizing layered structure 832 that is nearest to the upper shield 806.

In various embodiments, the electrical lead layers 810, 812 may or may not be in electrical communication with the associated shield 804, 806 or with the associated stabilizing layered structure 832, 842 (FIGS. 8A-10). In approaches where the spacer layers 814, 816 are insulative, various mechanisms for providing current to the sensor may be implemented.

Looking to FIGS. 8A-10, in some approaches, the sensor includes at least one stud 818, 820 electrically coupling the electrical lead layer 810, 812 to the shield 804, 806 closest thereto. In other words, first and second electrical lead layers 810, 812 are in electrical communication with the upper and lower shields 806, 804 respectively, by implementing studs 818, 820 at a location recessed from the media facing surface 850. The studs 818, 820 are not current carrying and therefore preferably have a relatively high resistance compared to the current-carrying portions of the head.

Studs 820, 818 preferably include one or more conductive materials, thereby effectively providing an electrical via through insulative spacer layers 814, 816 which allows current to flow between the shields 804, 806 and electrical lead layers 810, 812, respectively. Thus, although insulative spacer layers 814, 816 may separate the shields 804, 806 from the electrical lead layers 810, 812 and sensor 808, the studs 820, 818 allow current to flow from one shield to the other through the sensor layer.

According to an exemplary in-use embodiment as shown in FIG. 8A, which is in no way intended to limit the invention, the transducer structure 802 may achieve this functionality by diverting current from lower shield 804 such that it passes through stud 820 (the stud closest thereto) and into the second electrical lead 810. The current then travels towards the media facing surface 850 along the second electrical lead 810, and preferably passes through the tunneling sensor layer 808 near the media facing surface 850. As will be appreciated by one skilled in the art, the strength of a signal transduced from the magnetic transitions on a magnetic recording medium decreases along the sensor in the height direction (perpendicular to the media facing side). Thus, it is preferred that at least some of the current passes through the sensor layer 808 near the media facing surface 850, e.g., to ensure high sensor output. According to one approach, this may be accomplished by achieving ideally an approximate equipotential along the length of the sensor layer 808.

Studs 820, 818 preferably have about the same thickness as first and second spacer layers 814, 816 respectively. Moreover, studs 820, 818 are preferably positioned behind or extend past an end of the sensor layer 808 which is farthest from the media facing surface 850.

The electrically conductive layer(s) preferably have a higher conductivity than the spacer layer. Thus, the spacer layer in some embodiments may be insulating or a poor conductor. This helps ensure that a near equipotential is achieved along the length of the sensor layer. Also and/or alternatively, the resistance of the electrical lead layer along a direction orthogonal to a media facing surface may be less than a resistance across the sensor along a direction parallel to the media facing surface in some approaches. This also helps ensure that a near equipotential is achieved along the length of the sensor layer. In further approaches, the product of the spacer layer thickness multiplied by the conductivity of the spacer layer is less than a product of the electrical lead layer thickness multiplied by the conductivity of the electrical lead layer associated with the spacer layer, e.g., positioned on the same side of the sensor therewith.

Achieving near equipotential along the length of the sensor layer 808 results in an approximately equal current distribution along the length of the sensor layer 808 in the height direction. Thus, if each point along the length of the sensor layer 808 had an equal potential for an electron to tunnel therethrough, the distribution of current would be about equal as well along the length of the sensor layer 808. Moreover, insulating layer 822 which may include any one or more of the materials described herein, desirably ensures that current does not flow around (circumvent) the sensor layer 808. Although equipotential is preferred along the length of the sensor layer 808, a 20% or less difference in the voltage drop (or loss) across the sensor layer 808 at the media facing surface 850 compared to the voltage drop across the end of the sensor layer 808 farthest from the media facing surface 850 may be acceptable, e.g., depending on the desired embodiment. For example, a voltage drop of 1 V across the sensor layer 808 at the media facing surface 850 compared to a voltage drop of 0.8 V across the end of the sensor layer 808 farthest from the media facing surface 850 may be acceptable.

Although the operating voltage may be adjusted in some approaches to compensate for differences in the voltage drop along the length of the sensor layer 808 of greater than about 10%, it should be noted that the operating voltage is preferably not increased to a value above a threshold value. In other words, increasing the operating voltage above a threshold value is preferably not used to bolster the voltage drop across the sensor layer 808 at the media facing surface 850 to a desired level (e.g., sensitivity) when a transducer structure 802 has a drop of greater than about 10%. The threshold value for the operating voltage of a given approach may be predetermined, calculated in real time, be set in response to a request, etc. According to an exemplary approach, the threshold value for the operating voltage may be determined using the breakdown voltage(s) of the transducer structure 802 layers, e.g., based on their material composition, dimensions, etc.

In some embodiments, differences in resistivity may also be used to minimize the voltage drop along the length of the sensor layer 808. In order to ensure that sufficient current passes through the sensor layer 808 near the media facing surface 850, it is preferred that the resistivity of the sensor layer 808, as for example due to tunnel barrier resistivity in a TMR, is high relative to the resistivity of the electrical lead layers 810, 812. By creating a difference in the relative resistance of the adjacent layers, low voltage drop may desirably be achieved along the height of the sensor layer 808.

This relative difference in resistivity values may be achieved by forming the sensor layer 808 such that it has a relatively high barrier resistivity, while the electrical lead layers 810, 812 may have a higher thickness, thereby resulting in a lower resistance value. However, it should be noted that the thickness of the electrical lead layers 810, 812 is preferably greater than about 2 nm. The bulk resistivity of a given material typically increases as the dimensions of the material decreases. As will be appreciated by one skilled in the art upon reading the present description, the resistivity of a material having significantly small dimensions may actually be higher than for the same material having larger dimensions, e.g., due to electron surface scattering. Moreover, as the thickness of the electrical lead layers 810, 812 decreases, the resistance thereof increases. Accordingly, the thickness of the first and/or second electrical lead layers 810, 812 is preferably between about 2 nm and about 20 nm, more preferably between about 5 nm and about 15 nm, still more preferably less than about 15 nm, but may be higher or lower depending on the desired embodiment, e.g., depending on the material composition of the first and/or second electrical lead layers 810, 812. Moreover, the thicknesses (in the deposition direction) of the first and/or second spacer layers 814, 816 are preferably between about 5 nm and about 50 nm, but may be higher or lower depending on the desired embodiment. For example, spacer layers having a relatively hard material composition may be thinner than spacer layers having a material composition which is less hard.

In various embodiments, the magnetic reader transducer 802 includes a spacer layer 814, 816 that may be electrically conductive. In other embodiments, the spacer layer 814, 816 may be electrically insulating.

With continued reference to FIG. 8A, studs 818, 820 may be implemented during formation of the transducer structure 802, using processes which would be apparent to one skilled in the art upon reading the present description. According to an example, which is in no way intended to limit the invention, the spacer layer may be formed over a mask (e.g., using sputtering or other forms of deposition), thereby creating a void in the spacer layer upon removal of the mask. Thereafter, the stud may be formed in the void, e.g., using sputtering or plating, after which the stud may be planarized. However, according to another example, a spacer layer may be formed full film, after which a via may be created, e.g., using masking and milling, and filling the via with the stud material, e.g., using ALD, after which the stud may optionally be planarized. Moreover, it should be noted that insulating layer 822 may be thicker than sensor 808, thereby causing first electrical lead layer 810 and first spacer layer 814 to extend in the intended tape travel direction 852 before continuing beyond the edge of the sensor 808 farthest from the media facing surface 850, e.g., as a result of manufacturing limitations, as would be appreciated by one skilled in the art upon reading the present description.

Thus, the spacer layers 816, 814 in combination with the studs 818, 820 may provide protection against smearing at the media facing surface 850 while also allowing for the shields 806, 804 to be in electrical communication with the electrical lead layers 810, 812. It follows that one or both of the shields 806, 804 may serve as electrical connections for the transducer structure 802. According to the present embodiment, the shields 806, 804 function as the leads for the transducer structure 802. Moreover, the current which flows towards the media facing surface 850 tends to generate a magnetic field which is canceled out by the magnetic field created by the current which flows away from the media facing surface 850.

Although first and second spacer layers 814, 816 separate first and second electrical lead layers 810, 812 from the stabilizing layered structure 832 and from the upper and lower shields 806, 804 at the media facing surface 850 of the transducer structure 802, the first and/or second electrical lead layers 810, 812 are preferably still in electrical communication with the shields closest thereto.

Studs 818, 820 may be implemented during formation of the transducer structure 802, using processes which would be apparent to one skilled in the art upon reading the present description.

However, it should be noted that the embodiment illustrated in FIG. 8A is in no way intended to limit the invention. Although the electrical lead layers 810, 812 depicted in FIG. 8A are electrically connected to upper and lower shields 806, 804 respectively, in other embodiments, one or both of the electrical lead layers 810, 812 may not be electrically connected to the respective shields. According to one example, the first and second electrical lead layers may be stitched leads, e.g., see FIG. 11, rather than each of the lead layers 810, 812 having a single lead as seen in FIG. 8A, as will soon become apparent. Thus, neither of the first or second electrical lead layers may be in electrical communication with the shields according to some embodiments, as will be described in further detail below.

Figure 8B:
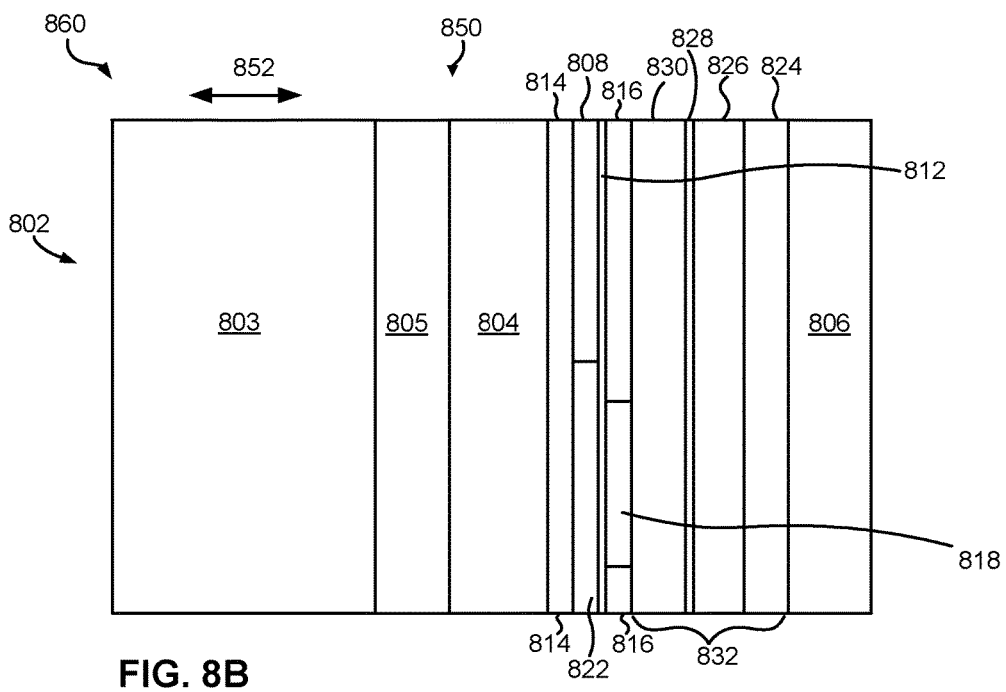
FIG. 8B is a partial side view of a media facing side of a transducer structure according to one embodiment.

FIG. 8B depicts an apparatus 860, in accordance with one embodiment. As an option, the present apparatus 860 may be implemented in conjunction with features from any other embodiment listed herein, such as those described with reference to the other FIGS. However, such apparatus 860 and others presented herein may be used in various applications and/or in permutations which may or may not be specifically described in the illustrative embodiments listed herein. Further, the apparatus 860 presented herein may be used in any desired environment. Thus FIG. 8B (and the other FIGS.) may be deemed to include any possible permutation.

Although it is preferred that a spacer layer is included on either side of the sensor 808 along the intended direction 852 of tape travel, some embodiments may only include one spacer layer positioned between one of the leads and the shield closest thereto, such that at least one of the leads, and preferably both leads, are electrically isolated from the shield closest thereto at the tape bearing surface.

In FIG. 8B, only a single hard spacer layer 816 is present. An apparatus may include a magnetic transducer 802 with spacers on opposite sides of the sensor 808 where one of the spacers 814 may include the electrically conductive ceramic layer, and the other of the spacer 816 may be dielectric. In the illustrative embodiment shown in FIG. 8B, the hard spacer layer 816 is positioned between the sensor 808 and the stabilizing layered structure 832 where the stabilizing layered structure 832 is positioned between the hard spacer layer 816 and the upper shield 806. An electrically conductive ceramic spacer layer 814 is positioned between the sensor 808 and the lower shield 804.

However, it should be noted that the embodiment illustrated in FIG. 8B is in no way intended to limit the invention. In one embodiment not shown, the dielectric spacer layer may be positioned between the sensor and the shield closest thereto (for example, the lower shield), and the electrically conductive ceramic spacer layer may be positioned between sensor and the stabilizing layered structure closest thereto where the stabilizing layered structure is positioned between the ceramic spacer layer and the shield closest thereto (for example the upper shield).

In another embodiment not shown, the dielectric spacer layer and the electrically conductive ceramic spacer layer may be positioned on opposite sides of the sensor with the one of the spacers between the sensor and a first stabilizing layered structure and the other spacer positioned between the sensor and the second stabilizing layered structure.

Figure 9:
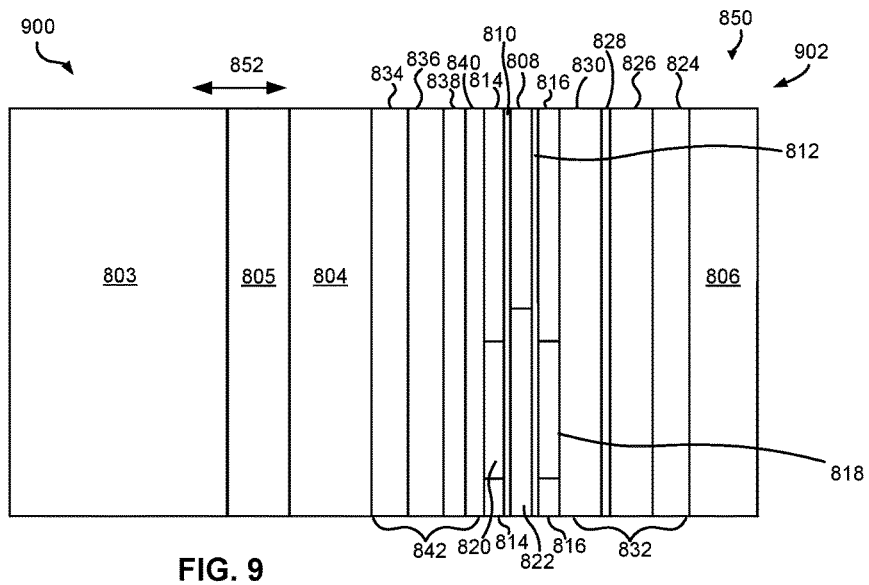
FIG. 9 is a partial side view of a media facing side of a transducer structure according to one embodiment.

Referring now to FIG. 9, the magnetic read transducer 902 of apparatus 900 is shown to include stabilizing layered structures 832, 842 between each of the magnetic shields 804, 806 and the sensor 808. FIG. 9 illustrates a variation of the embodiment of FIG. 8A. Accordingly, various components of FIG. 9 have common numbering with those of FIGS. 8A-8B.

As an option, the present apparatus 900 may be implemented in conjunction with features from any other embodiment listed herein, such as those described with reference to the other FIGS. Of course, however, such apparatus 900 and others presented herein may be used in various applications and/or in permutations which may or may not be specifically described in the illustrative embodiments listed herein. Further, the apparatus 900 presented herein may be used in any desired environment.

Similar to apparatus 800, apparatus 900 may also include an array of magnetic read transducers. For example, although FIG. 9 illustrates only a single magnetic read transducer 902, apparatus 900 may include one or more additional magnetic read transducers on a remainder of a module, e.g., see FIGS. 2A-4. Accordingly, the components and/or configurations of magnetic read transducer 902 may be incorporated in any magnetic read transducers described herein.

The magnetic read transducer 902 includes a stabilizing layered structure 832, 842 between each of the magnetic shields 806, 804 and the sensor 808. Particularly, magnetic read transducer 902 includes a first stabilizing layered structure 832 and a second stabilizing layered structure 842.

Similar to the first stabilizing layered structure 832, the second stabilizing layered structure 842 may include a first FM layer 836 and a second FM layer 840. The second stabilizing layered structure 842 may also include an AP coupling layer 838 between the FM layers 836, 840.

The stabilizing layered structure 842 may include an AFM layer 834. The AFM layer 834 may be positioned between the first FM layers 836 and the magnetic shield closest thereto, e.g., magnetic shield 804.

The magnetic read transducer 902 may also include electrical lead layers 810, 812 and spacer layers 814, 816 between the sensor 808 and each of the stabilizing layered structures 832, 842. For example, in addition to the first electrical lead layer 812 positioned between the sensor 808 and the first spacer layer 816 and the first stabilizing layered structure 832 positioned between the first spacer layer 816 and the upper shield 806, the magnetic read transducer 902 may include a second electrical lead layer 810 positioned between the sensor 808 and a second spacer layer 814 and the second stabilizing layered structure 842 positioned between the second spacer layer 814 and the lower shield 804.

In some approaches the spacer layers 814, 816 may be dielectric. In another approach, the spacer layers 814, 816 may be ceramic. In yet another approach, the spacer layers 814, 816 may be dielectric and ceramic.

Including stabilizing layered structures 832, 842 between each of the magnetic shields 804, 806 and the sensor 808 may provide advantages on both sides of the sensor similar to those described above for the single stabilizing layered structure 832 of the magnetic read transducer 802 of FIG. 8A.

According to various embodiments, an adhesion layer (not shown) may be included between one or more of the stabilizing layered structures 826, 842 and the magnetic shield, e.g., lower magnetic shield 804 and/or upper magnetic shield 806, closest thereto. The one or more adhesion layer(s) may include, e.g., ruthenium, tantalum, a conventional adhesion layer of a type known in the art, etc.

Figure 10:
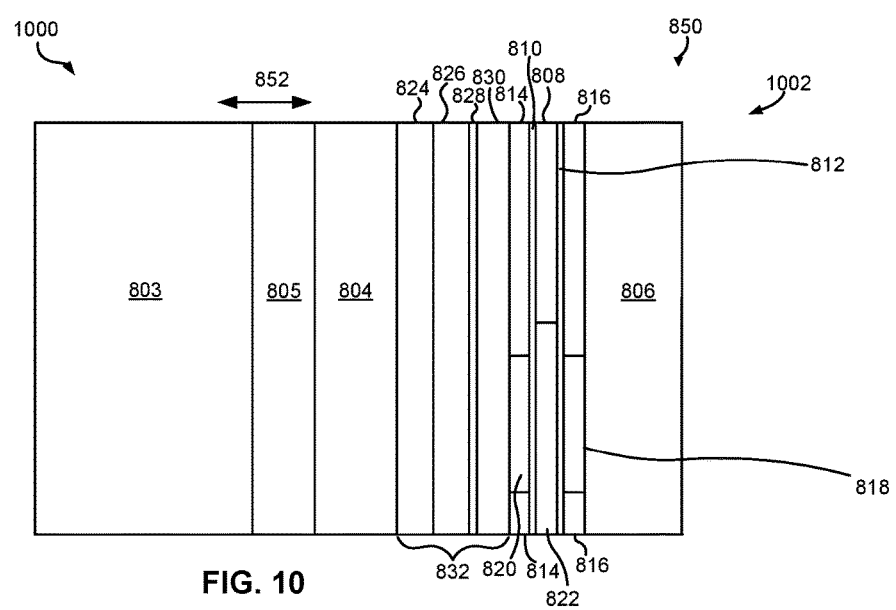
FIG. 10 is a partial side view of a media facing side of a transducer structure according to one embodiment.

Referring now to FIG. 10, in yet another embodiment, a magnetic read transducer 1002 of apparatus 1000, may include a stabilizing layered structure 832 between the lower magnetic shield 804 and the sensor 808. Various components of FIG. 10 have common numbering with those of FIGS. 8 and 9.

Figure 11:
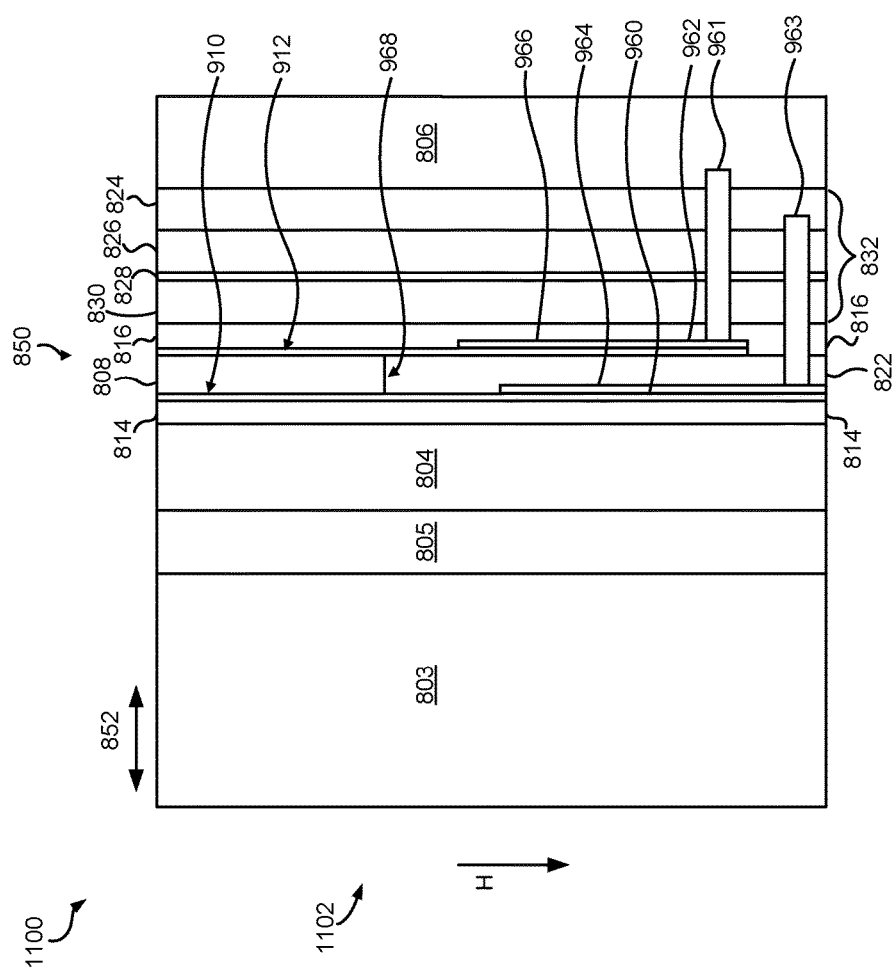
FIG. 11 is a partial side view of a media facing side of a transducer structure according to one embodiment.

Looking to FIG. 11, apparatus 1100 depicts a transducer structure 1102 in accordance with one embodiment. As an option, the present apparatus 1100 may be implemented in conjunction with features from any other embodiment listed herein, such as those described with reference to the other FIGS. Specifically, FIG. 11 illustrates variations of the embodiment of FIGS. 8-10 depicting several exemplary configurations within the transducer structure 1102. Accordingly, various components of FIG. 11 have common numbering with those of FIGS. 8-10.

However, such apparatus 1100 and others presented herein may be used in various applications and/or in permutations which may or may not be specifically described in the illustrative embodiments listed herein. Further, the apparatus 1100 presented herein may be used in any desired environment. Thus FIG. 11 (and the other FIGS.) may be deemed to include any possible permutation.

As mentioned above, the electrical lead layers may not be in electrical communication with the associated shield or with the associated stabilizing layered structures. Looking to FIG. 11, apparatus 1100 includes a transducer structure 1102 that may have spacer layers 814, 816 sandwiched between shields 804, 806, in which a stabilizing layered structure 832 is between the spacer 816 and upper shield 806, and electrical lead layers 910, 912 respectively. Note, in other embodiments, there may be a second stabilizing layered structure (see 842, FIG. 9) between the spacer 814 and the lower shield 804. However, unlike the embodiments illustrated in FIGS. 9-10, first and second electrical lead layers 910, 912 of the present embodiment may not be in electrical communication with either of the shields 806, 804 and/or the stabilizing layered structures 832, 842. Rather, when the spacer layers 814, 816 are insulating and fully isolate electrical lead layers 910, 912 from upper and lower shields 806, 804 respectfully along the lengths (perpendicular to the media facing surface 850) thereof. Thus, a current (e.g., a read sense current) does not pass through at least one of the upper and lower shields from the CPP sensor 808 and/or electrical lead layers 910, 912. In other words, the electrical connection to one or both of the electrical lead layers 910, 912 may be independent. As mentioned above, first and/or second spacer layers 814, 816 may include at least one of aluminum oxide, chrome oxide, silicon nitride, boron nitride, silicon carbide, silicon oxide, titanium oxide, an amorphous aluminum oxide, etc., and/or combinations thereof, and conducting.

In some approaches the spacer layers 814, 816 may be dielectric. In another approach, the spacer layers 814, 816 may be ceramic. In yet another approach, the spacer layers 814, 816 may be dielectric and ceramic.

As mentioned above, at least one of the first and second electrical lead layers may be a stitched lead. According to the present embodiment, which is in no way intended to limit the invention, both electrical lead layers 910, 912 are stitched leads which include a main layer 960, 962 and a preferably thicker stitch layer 964, 966 thereon, respectively. Vias 961, 963 may be coupled to a respective electrical lead layer 910, 912. The main layers 960, 962 may be made during formation of the transducer structure 902, while stitch layers 964, 966 may be drilled and backfilled after formation of the transducer structure 902 using processes and/or in a direction which would be apparent to one skilled in the art upon reading the present description.

As shown, the stitch layers 964, 966 are preferably recessed from a media facing side of the main layer 960, 962, e.g., the side closes to the media facing surface 850. By stitching a second layer of lead material, e.g. the stitch layer 964, 966, which is preferably recessed beyond a back edge 968 of the sensor 808 in the height direction H, the resistance associated with the electrical lead layers 910, 912 may desirably be reduced, e.g., relative to routing either of the leads past a back edge of the respective shield. In various embodiments, the main layers 960, 962 and/or a stitch layers 964, 966 of either of the stitched electrical lead layers 910, 912 may be constructed of any suitable conductive material, e.g., which may include Jr, Cu, Ru, Pt, NiCr, Au, Ag, Ta, Cr, etc.; a laminated structure of Ta (e.g. Ta/X/Ta); etc.

In some approaches, a resistance of the electrical lead layer 910, 912 along a direction orthogonal to a media facing surface 850 may be less than a resistance across the sensor along a direction parallel to the media facing surface 850.

In yet another embodiment (not shown), the magnetic read transducer may include vias 961, 963 like those of FIG. 1100, and studs 818, 820 like those in FIGS. 8A-10. The studs 818, 820 may not be current carrying and therefore preferably have a relatively high resistance compared to the current-carrying portions of the head.

Conductive metallic films near the TMR that are susceptible to smearing may also have bending ductility that would lead to deformation of the head. Thus, deformed magnetic films may have a propensity to magnetically shield the sensor from the tape signal. A harder, less-ductile yet conductive metal or non-metallic material would be a desirable choice for the spacer near the TMR.

Various embodiments described have the stabilizing layered structures below the top and/or bottom shields with ceramic spacers positioned between the stabilizing layered structure and the TMR sensor, thereby improving shield-to-sensor or shield-to-shield shorting which causes diminished sensor accuracy and/or total inoperability. Furthermore, the combination of antiferromagnetic stabilizing structures positioned above and/or below the shields and the harder, less-ductile conductive ceramic spacers positioned in close proximity to the sensing structure may also synergistically reduce noise.

Figure 12:
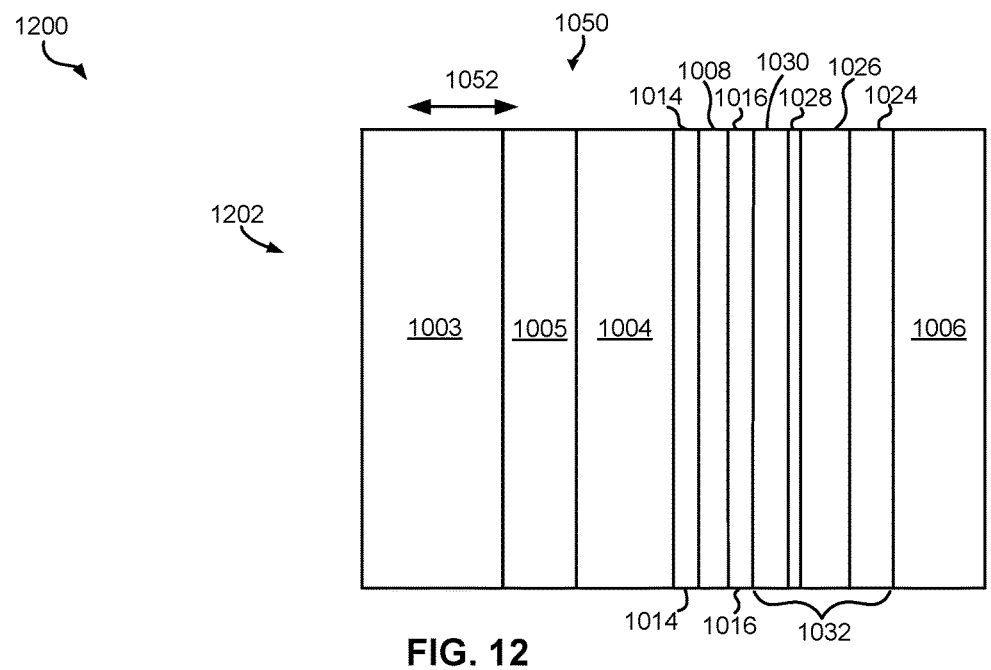
FIG. 12 is a partial side view of a media facing side of a transducer structure according to one embodiment.

Looking to FIG. 12, apparatus 1200 depicts a transducer structure 1202 in accordance with one embodiment. As an option, the present apparatus 1200 may be implemented in conjunction with features from any other embodiment listed herein, such as those described with reference to the other FIGS. Specifically, FIG. 12 illustrates variations of the embodiment of FIGS. 8-11 depicting several exemplary configurations within the transducer structure 1202. Accordingly, various components of FIG. 12 have common numbering with those of FIGS. 8-11.

It will be clear that the various features of the foregoing systems, apparatuses and/or methodologies may be combined in any way, creating a plurality of combinations from the descriptions presented above.

Although FIG. 12 shows only one embodiment, the apparatus 1200 may include an array of magnetic transducers 1202, each having a CPP sensor 1008 which has a lower shield 1004 above a wafer 1003. In some approaches, there may be an optional undercoat 1005 positioned between the wafer and the lower shield 1004. The magnetic transducer 1202 may include magnetic shields 1004, 1006 on opposite sides of the sensor 1008 in an intended direction of media travel 1052 thereacross. As described above and illustrated in FIG. 12, the magnetic transducer 1202 may include a stabilizing layered structure 1032 between at least one of the magnetic shields, for example, the upper shield 1006, and the sensor 1008.

The stabilizing layered structure 1032 may include a first FM layer 1026 and a second FM layer 1030. The stabilizing layered structure 1032 may also include an AP coupling layer 1028 between the FM layers 1026, 1030.

The stabilizing layered structure 1032 may include an AFM layer 1024. The AFM layer 1024 may be positioned between the first FM layers 1026 and the magnetic shield closest thereto, e.g., magnetic shield 1006.

Figure 13:
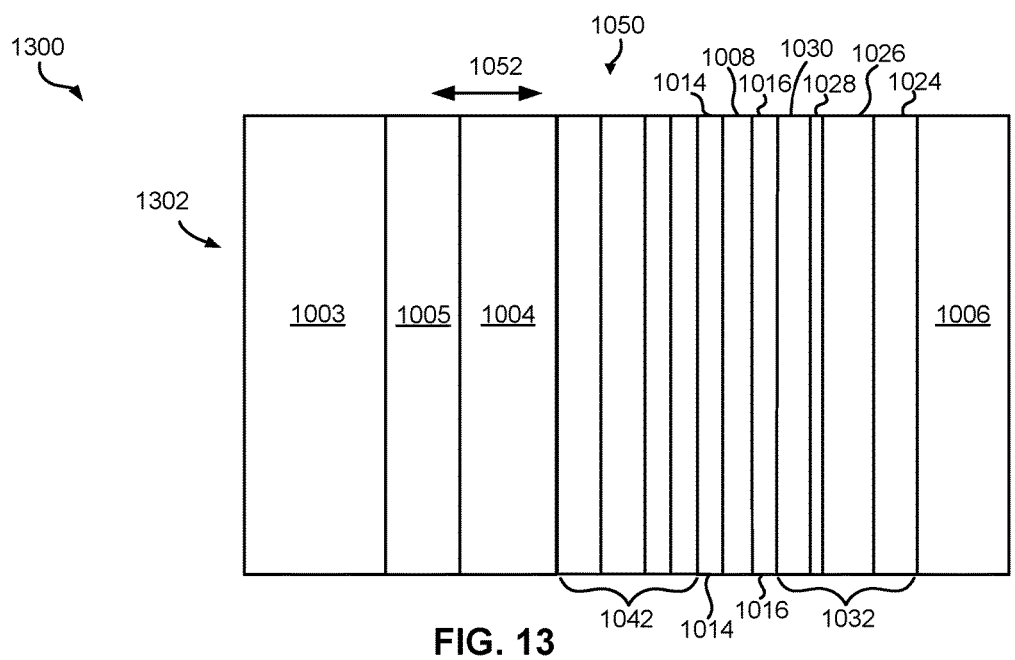
FIG. 13 is a partial side view of a media facing side of a transducer structure according to one embodiment.

Looking to FIG. 13, apparatus 1300 depicts a transducer structure 1302 in accordance with one embodiment. As an option, the present apparatus 1300 may be implemented in conjunction with features from any other embodiment listed herein, such as those described with reference to the other FIGS. Specifically, FIG. 13 illustrates variations of the embodiment of FIG. 12 depicting several exemplary configurations within the transducer structure 1302. Accordingly, various components of FIG. 13 have common numbering with those of FIG. 12.

It will be clear that the various features of the foregoing systems, apparatuses and/or methodologies may be combined in any way, creating a plurality of combinations from the descriptions presented above.

In another embodiment, depicted in FIG. 13, the magnetic transducer 1301 may include a second stabilizing layered structure 1042 that may be positioned between the lower shield 1004 and the sensor 1008. On the opposite side of the sensor, the first stabilizing layered structure 1032 may be positioned between the upper shield 1006 and the sensor 1008 in an intended direction of media travel 1052 thereacross. Except as otherwise described herein, the various components of the apparatus of FIGS. 12-13 may be of conventional materials and designs, as would be understood by one skilled in the art. Moreover, except as otherwise described herein, conventional processes may be used to form the various components of the various embodiments described herein.

The magnetic transducers may also may include spacers 1014, 1016 on opposite sides of the sensor 1008 in an intended direction of media travel 1052 thereacross. In one embodiment as shown in FIG. 12, one of the spacers 1016 may be positioned between the sensor 1008 and the stabilizing layered structure 1032 and/or the magnetic shields 1004, 1006. In another embodiment as shown in FIG. 13, the spacers 1014, 1016 may be positioned between the sensor 1008 and each of the stabilizing layered structures 1032, 1042. In yet another embodiment (not shown), a spacer may be positioned between the sensor and the lower shield (closest shield thereto) and a second spacer may be positioned between the sensor and the upper shield.

In an exemplary embodiment, one of the spacers 1014, 1016 includes an electrically conductive ceramic layer.

With continued reference to FIGS. 12-13, at least one of the spacers 1014, 1016 between the sensor 1008 and the magnetic shields 1004, 1006 and/or stabilizing layered structures 1032, 1042 (see FIG. 13) preferably includes an electrically conductive ceramic layer, which preferably is composed entirely of ceramic material. The other spacer may also have an electrically conductive ceramic layer of the same or different composition, and/or can include a layer of a metal or metallic alloy, can include a layer of a refractory material. In further approaches, the other spacer layer may be metallic or a metallic alloy. It should be noted that the spacers 1014, 1016 shown in the figures are representational, and do not depict the various potential layers therein that may cumulatively form the spacers 1014, 1016 according to various embodiments. Thus, according to some embodiments, one or both of the spacers 1014, 1016 may include layers in addition to the electrically conductive ceramic layer, including, but not limited to seed layers (e.g., Cr, Ta, etc.), nonmagnetic spacer layers, AFM layers, etc. For example, a seed layer may be disposed between the ceramic material and a surface underlying the ceramic material. However, in other embodiments, the electrically conductive layer may form the whole of one or both spacers 1014, 1016. Furthermore, there may be a second electrically conductive ceramic layer between the active TMR and at least one of the spacers that include the first ceramic layer.

Depending on the desired embodiment, the electrically conductive layer may be formed using a single ceramic material; however, in other embodiments, the electrically conductive layer may have a layered structure. Thus, an electrically conductive layer may be formed from a number of sublayers, each of which may include a different ceramic material according to any of those listed herein.

Illustrative thicknesses for the spacers 1014, 1016 and/or layer of ceramic material therein may be at least 2 nm per film, which may help ensure adequate crystallinity. Preferably, the thicknesses of the spacers 1014, 1016 and/or layer of ceramic material therein are at least 8 nm, and ideally at least 10 nm.

Ceramic materials according to some embodiments tend to have high hardness and strength in compression. Illustrative materials for the electrically conductive ceramic layer include ceramic materials that are hard, non-ductile and non-metallic (non-elemental metal), such as metal alloys, e.g. alumina and/or transition metal alloys, e.g., titanium nitride, zirconia, ruthenium oxide, iridium oxide, etc., and/or silicon nitride or silicon carbide, and/or alloys thereof. However, in other embodiments, the ceramic material may include, but is not limited to, an electrically conductive oxide, a conductive nitride, and/or a conductive carbide.

The hardness of the ceramic material in the layer provides an advantage of reducing susceptibility to conductive bridging and at the same time not requiring excessive head-tape spacing, such as may be needed for coatings and pre-recession.

In one embodiment, the ceramic layer between the TMR sensor 1008 as shown in FIGS. 12-13 and the magnetic shields 1004, 1006 and/or the stabilizing layered structures 1032, 1042 includes ruthenium oxide ($RuO_2$). $RuO_2$ is a surprisingly hard conductive ceramic having a Vickers hardness of 19.2 to 28.6 GPa, which is significantly higher than the Vickers hardness of, for example, iridium (1.76-2.10 GPa). Moreover, as a conductive ceramic, $RuO_2$ has higher electrical resistivity of ~35 μohm-cm compared to ~13 μohm-cm for Tantalum (Ta), for example.

In one approach, the ceramic layer of the spacer between the TMR sensor 1008 as shown in FIGS. 12-13 and the magnetic shields 1004, 1006 and/or the stabilizing layered structures 1032, 1042 is at least partially crystalline. Preferably, the $RuO_2$ in the ceramic layer is at least partially crystalline. Crystalline $RuO_2$ may be grown using known techniques, for example, by room temperature DC reactive magnetron sputtering, which does not require post-deposition annealing, and thus is compatible with tape head wafer fabrication processes.

Furthermore, there may be a second electrically conductive ceramic layer between the active TMR sensor and at least one of the spacers that include the first ceramic layer. In some embodiments, both spacers may include an electrically conductive ceramic layer. In some approaches, the electrically conductive ceramic layer of one of the spacers may have a different composition than the electrically conductive ceramic layer of the other of the spacers.

Note that while much of the present description is presented in terms of a data transducer, the teachings herein may be applied to create electronic lapping guides (ELGs), such as TMR ELGs. In one embodiment, the ELG is unconventionally formed with shields, and with a TMR structure that may be otherwise conventional, but modified as taught herein. This provides enhanced immunity to shunting caused by scratching during lapping, which was previously not possible due to smearing of the shield material during lapping.

Various embodiments described herein are able to provide bi-directional protection for CPP transducers against shorting which may otherwise result from passing magnetic media over such transducers. Implementing a spacer layer having a high resistivity to smearing and/or plowing between the CPP transducer layer and each of the conducting lead portions of the transducer stack without hindering the flow of current through the sensor enables the embodiments herein to maintain desirable performance over time. Moreover, as previously mentioned, although it is preferred that a spacer layer is included on either side of a sensor along the intended direction of tape travel, some of the embodiments described herein may only include one spacer layer positioned between one of the leads or sensor and the shield closest thereto, such that the at least one lead is electrically isolated from the shield closest thereto.

Various embodiments may be fabricated using known manufacturing techniques. Conventional materials may be used for the various layers unless otherwise specifically foreclosed. Furthermore, as described above, deposition thicknesses, configurations, etc. may vary depending on the embodiment.

It should be noted that although FIGS. 8A-13 each illustrate a single transducer 802, 860, 902. 1002, 1102, 1202, 1302 various embodiments described herein include at least eight of the transducer structures above a common substrate, e.g., as shown in FIG. 2B. Furthermore, the number of transducer structures in a given array may vary depending on the preferred embodiment.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. An apparatus, comprising:
   an array of magnetic transducers each having:
   a current-perpendicular-to-plane sensor;
   a stabilizing layered structure adjacent the sensor, the stabilizing layered structure including:
   a first ferromagnetic layer,
   a second ferromagnetic layer, and
   an antiparallel coupling layer between the ferromagnetic layers;
   an electrical lead layer between the sensor and the stabilizing layered structure, wherein the electrical lead layer is in electrical communication with the sensor; and
   a spacer layer between the electrical lead layer and the stabilizing layered structure,
   wherein a conductivity of the electrical lead layer is higher than a conductivity of the spacer layer.

2. An apparatus as recited in claim 1, wherein a first electrical lead layer is present between the sensor and an upper shield, wherein a second electrical lead layer is present between the sensor and a lower shield, wherein a first spacer layer is present between the upper shield and the first electrical lead layer, wherein a second spacer layer is present between the lower shield and the second electrical lead layer, wherein a conductivity of the electrical lead layer is higher than a conductivity of the spacer layer.

3. An apparatus as recited in claim 1, wherein the spacer layer includes at least one of: aluminum oxide, chrome oxide, silicon nitride, boron nitride, silicon carbide, silicon oxide, titanium oxide, and titanium nitride.

4. An apparatus as recited in claim 1, wherein the electrical lead layer includes a main layer and a stitch layer thereon, the stitch layer being recessed from a media facing side of the main layer.

5. An apparatus as recited in claim 1, wherein a resistance of the electrical lead layer along a direction orthogonal to a media facing surface is less than a resistance across the sensor along a direction parallel to the media facing surface.

6. An apparatus as recited in claim 1, wherein the spacer layer is electrically conductive.

7. An apparatus as recited in claim 1, wherein the spacer layer is electrically insulating.

8. An apparatus as recited in claim 1, wherein each stabilizing layered structure includes an antiferromagnetic layer for pinning a magnetization direction in the first ferromagnetic layer along an antiferromagnetic polarized direction of the antiferromagnetic layer.

9. An apparatus as recited in claim 1, wherein the electrical lead layer is in electrical communication with one shield of the associated magnetic transducer.

10. An apparatus as recited in claim 1, wherein the electrical lead layer is not in electrical communication with one shield of the associated magnetic transducer.

11. An apparatus as recited in claim 1, wherein the sensor is a tunneling magnetoresistive sensor.

12. An apparatus, comprising:
    an array of magnetic transducers each having:
    a current-perpendicular-to-plane sensor;
    a stabilizing layered structure adjacent the sensor, the stabilizing layered structure including:
    a first ferromagnetic layer,
    a second ferromagnetic layer, and
    an antiparallel coupling layer between the ferromagnetic layers; and
    spacers on opposite sides of the sensor, at least one of the spacers being positioned between the sensor and the stabilizing layered structure, wherein at least one of the spacers includes an electrically conductive ceramic layer,
    wherein both spacers include an electrically conductive ceramic layer,
    wherein the electrically conductive ceramic layer of one of the spacers has a different composition than the electrically conductive ceramic layer of the other of the spacers.

13. An apparatus as recited in claim 12, wherein a thickness of the electrically conductive ceramic layer is at least 2 nanometers.

14. An apparatus as recited in claim 12, wherein the electrically conductive ceramic layer includes ruthenium oxide.

15. An apparatus as recited in claim 12, wherein the electrically conductive ceramic layer is at least partially crystalline.

16. An apparatus as recited in claim 12, wherein the electrically conductive ceramic layer includes at least one material selected from a group consisting of: alumina, titanium nitride, zirconia, ruthenium oxide, iridium oxide, silicon nitride, and silicon carbide.

17. An apparatus as recited in claim 12, wherein the sensor is an electronic lapping guide.

* * * * *